United States Patent
Sim et al.

(10) Patent No.: US 11,262,656 B2
(45) Date of Patent: Mar. 1, 2022

(54) COATING COMPOSITIONS FOR USE WITH AN OVERCOATED PHOTORESIST

(71) Applicant: Rohm and Haas Electronic Materials Korea Ltd., Ghungcheongnam-Do (KR)

(72) Inventors: Jae Hwan Sim, Gyeonggi-do (KR); Hye-Won Lee, Gyeonggi-do (KR); Eunhye Cho, Gyeonggi-do (KR); Jung Kyu Jo, Gyeonggi-do (KR); Jin Hong Park, Gyeonggi-do (KR); Eui Hyun Ryu, Gyeonggi-do (KR); Jae-Bong Lim, Chungnam (KR)

(73) Assignee: Rohm and Haas Electronic Materials Korea Ltd., Chungcheongnam-do (KR)

( * ) Notice: Subject to any disclaimer, the term of this patent is extended or adjusted under 35 U.S.C. 154(b) by 0 days.

(21) Appl. No.: 15/088,091

(22) Filed: Mar. 31, 2016

(65) Prior Publication Data

US 2017/0283651 A1   Oct. 5, 2017

(51) Int. Cl.
```
C08L 67/00      (2006.01)
C08L 63/00      (2006.01)
G03F 7/11       (2006.01)
C08G 73/06      (2006.01)
G03F 7/09       (2006.01)
C08L 33/08      (2006.01)
C08G 63/685     (2006.01)
C09D 167/02     (2006.01)
C08G 63/183     (2006.01)
C08G 63/189     (2006.01)
C08G 63/682     (2006.01)
C08F 220/14     (2006.01)
```

(52) U.S. Cl.
CPC ........... *G03F 7/091* (2013.01); *C08G 63/183* (2013.01); *C08G 63/189* (2013.01); *C08G 63/6826* (2013.01); *C08G 63/6856* (2013.01); *C08G 73/0638* (2013.01); *C08L 33/08* (2013.01); *C08L 63/00* (2013.01); *C08L 67/00* (2013.01); *C09D 167/02* (2013.01); *G03F 7/11* (2013.01); *C08F 220/14* (2013.01)

(58) Field of Classification Search
CPC .......... G03F 7/0046; G03F 7/11; G03F 7/091; G03F 7/094; G03F 7/0007; H01L 21/0276; C08G 73/0638
USPC ...................................... 430/271.1
See application file for complete search history.

(56) References Cited

U.S. PATENT DOCUMENTS

| | | | | | |
|---|---|---|---|---|---|
| 4,105,613 A | * | 8/1978 | Clope | ................... | C09D 163/00 427/486 |
| 5,597,868 A | * | 1/1997 | Kunz | ....................... | G03F 7/091 525/154 |
| 5,939,510 A | * | 8/1999 | Sato | ........................ | G03F 7/091 430/271.1 |
| 6,025,117 A | * | 2/2000 | Nakano | .................... | G03F 7/091 216/2 |
| 6,114,085 A | * | 9/2000 | Padmanaban | ........... | G03F 7/091 430/270.1 |
| 6,492,092 B1 | * | 12/2002 | Foster | ..................... | G03F 7/091 430/271.1 |
| 6,797,451 B2 | * | 9/2004 | Hong | ...................... | G03F 7/091 430/270.1 |
| 6,818,381 B2 | * | 11/2004 | Khojasteh | ............. | G03F 7/0045 430/271.1 |
| 6,852,421 B2 | * | 2/2005 | Wayton | ................... | G03F 7/091 428/480 |
| 9,324,604 B2 | * | 4/2016 | Sim | ................... | H01L 21/76224 |
| 2003/0018150 A1 | | 1/2003 | Hong et al. | | |
| 2003/0166828 A1 | * | 9/2003 | Cox | ........................ | G03F 7/091 528/335 |
| 2004/0110096 A1 | * | 6/2004 | Kishioka | .............. | C08G 18/791 430/313 |
| 2008/0102649 A1 | * | 5/2008 | Takei | ...................... | G03F 7/091 438/781 |
| 2008/0312400 A1 | * | 12/2008 | Yamashita | ............. | C08G 77/28 528/30 |
| 2009/0130595 A1 | * | 5/2009 | Kawana | .................. | G03F 7/091 430/272.1 |
| 2010/0151381 A1 | | 6/2010 | Tachibana et al. | | |
| 2011/0200938 A1 | | 8/2011 | Yao et al. | | |
| 2012/0171626 A1 | | 7/2012 | Wang et al. | | |
| 2012/0301828 A1 | | 11/2012 | Tachibana et al. | | |

(Continued)

FOREIGN PATENT DOCUMENTS

| CN | 102681336 A | 9/2012 |
|---|---|---|
| EP | 2258691 A1 * | 12/2010 |

(Continued)

OTHER PUBLICATIONS

Pham et al. "Epoxy Reins" in Ulmann's Encyclopedia of Polymer Science and Technology, 3rd Ed., year 2005, 94 pages. (Year: 2005).*

(Continued)

*Primary Examiner* — Duane Smith
*Assistant Examiner* — Nicholas E Brown
(74) *Attorney, Agent, or Firm* — Mintz Levin Cohn Ferris Glovsky and Popeo, P.C.; Peter F. Corless

(57) ABSTRACT

Organic coating compositions, particularly antireflective coating compositions for use with an overcoated photoresist, are provided that comprise that a blend of two or more resins, where one resin has epoxy groups either pendant or fused to the polymer backbone. Preferred coating compositions include: 1) a first resin that comprises one or more epoxy reactive groups; and 2) a crosslinker resin that is distinct from the first resin and comprises epoxy groups.

20 Claims, 1 Drawing Sheet

(56) References Cited

U.S. PATENT DOCUMENTS

| | | | | |
|---|---|---|---|---|
| 2013/0280656 A1* | 10/2013 | Lowes | ............ | G03F 7/091 |
| | | | | 430/311 |
| 2014/0228488 A1* | 8/2014 | Tamura | ............ | C09D 11/10 |
| | | | | 524/111 |
| 2015/0185614 A1* | 7/2015 | Sim | ............ | G03F 7/091 |
| | | | | 430/324 |
| 2016/0187781 A1* | 6/2016 | Kang | ............ | G03F 7/091 |
| | | | | 430/325 |

FOREIGN PATENT DOCUMENTS

| | | | |
|---|---|---|---|
| EP | 2275490 A1 * | 1/2011 | |
| JP | 2010139822 A | 6/2010 | |
| JP | 2012247777 A | 12/2012 | |
| TW | 201137525 A | 11/2011 | |

OTHER PUBLICATIONS

English language summary of China Office Action dated Jul. 17, 2019 issued in counterpart China application (5 pages). Application No. 201710740697.X.

English language summary of Taiwan Office Action dated Mar. 6, 2018 issued in counterpart Taiwan application (4 pages). Application No. 106110035.

English language summary of Japan Office Action dated Feb. 28, 2018 issued in counterpart Japan application (2 pages). Application No. 2017-062956.

* cited by examiner

COATING COMPOSITIONS FOR USE WITH AN OVERCOATED PHOTORESIST

BACKGROUND

The present invention relates to compositions and, in particular, antireflective coating compositions for use in microelectronic application Compositions of the invention comprise a blend of two or more resins, where one resin has epoxy groups either pendant or fused to the polymer backbone polymeric crosslinker component. Preferred compositions of the invention are used with an overcoated photoresist composition and may be referred to as bottom antireflective compositions or "BARCs".

Photoresists are photosensitive films used for the transfer of images to a substrate. A coating layer of a photoresist is formed on a substrate and the photoresist layer is then exposed through a photomask to a source of activating radiation. Following exposure, the photoresist is developed to provide a relief image that permits selective processing of a substrate.

Reflection of activating radiation used to expose a photoresist often poses limits on resolution of the image patterned in the photoresist layer. Reflection of radiation from the substrate/photoresist interface can produce spatial variations in the radiation intensity in the photoresist, resulting in non-uniform photoresist linewidth upon development. Radiation also can scatter from the substrate/photoresist interface into regions of the photoresist where exposure is non-intended, again resulting in linewidth variations.

One approach used to reduce the problem of reflected radiation has been the use of a radiation absorbing layer interposed between the substrate surface and the photoresist coating layer. See EP2000852B1, KR1362661B1, U.S. Pat. Nos. 5,677,112A, 6,818,381B2, 8,338,078B2, 8,181,247B2, US20080102649A1, KR2010074607A, U.S. Pat. No.9,181, 426B2, WO2009035290A2, WO2013023124A2.

For many high performance lithographic applications, particular antireflective compositions are utilized in order to provide the desired performance properties, such as optimal absorption properties and coating characteristics. See, for instance, the above-mentioned patent documents. Nevertheless, electronic device manufacturers continually seek increased resolution of a photoresist image patterned over antireflective coating layers and in turn demand ever-increasing performance from an antireflective composition.

It thus would be desirable to have new antireflective compositions for use with an overcoated photoresist. It would be particularly desirable to have new antireflective compositions that exhibit enhanced performance and could provide increased resolution of an image patterned into an overcoated photoresist.

SUMMARY

We now provide new coating compositions that can be used with overcoated photoresist compositions. In preferred aspects, coating compositions of the invention can function as an effective antireflective layer for an overcoated resist layer.

In a preferred aspect, organic coating compositions, particularly antireflective compositions for use with an overcoated photoresist, are provided that comprise a blend of two or more separate resins, where one resin has epoxy groups either pendant or fused to the polymer backbone.

Preferred coating compositions include: 1) a first resin that comprises one or more epoxy reactive groups; and 2) a crosslinker resin that is distinct from the first resin and comprises epoxy groups. Epoxy reactive groups include functional groups that can react with a substituent that contains an epoxy moiety, for example, via a nucleophilic substitution reaction. Exemplary epoxy reactive groups may include a group comprising one or more nucleophilic oxygen, nitrogen or sulfur atoms that can react with an epoxy group including at elevated temperatures (e.g. a spin-coated layer of a composition with the resin having epoxy reactive groups heated at 200° C. or greater for 30 or 60 seconds or more) such as hydroxyl, amine and/or thio moieties, including hydroxy such as alcohol, phenoxy, or carboxy; primary, secondary or tertiary amines; and sulfide, sulfoxy and sulfono moieties; as well as protected forms of such moieties such as amide or carbamate that can react with an epoxy. Such protected forms will comprise one or more nucleophilic oxygen, nitrogen or sulfur atoms that can react with an epoxy group including at elevated temperatures (e.g. a spin-coated layer of a composition with the resin having epoxy reactive groups heated at 200° C. or greater for 30 or 60 seconds or more). In certain aspects, epoxy reactive groups do not include carboxy.

Preferably, the first resin of the coating composition 1) comprises one more epoxy reactive groups and 2) is substantially, essentially or completely free of any epoxy moieties. The resin will be at least substantially free of epoxy groups where less than 15, 13, 12, 11, 10, 9, 8, 7, 6, or 5 weight percent (based on total weight of the resin) of resin repeat units comprise one or more epoxy groups. The resin will be at least essentially free of epoxy groups where less than 4, 3, 2, 1 or 0.5 weight percent (based on total weight of the resin) of resin repeat units comprise one or more epoxy groups.

Preferably, the second resin of the coating composition 1) comprises one more epoxy moieties and 2) is substantially, essentially or completely free of any epoxy reactive groups moieties. The resin will be at least substantially free of epoxy reactive groups where less than 15, 13, 12, 11, 10, 9, 8, 7, 6, or 5 weight percent (based on total weight of the resin) of resin repeat units comprise one or more epoxy reactive groups. The resin will be at least essentially free of epoxy groups where less than 4, 3, 2, 1 or 0.5 weight percent (based on total weight of the resin) of resin repeat units comprise one or more epoxy reactive groups Particularly suitable crosslinker resins (second resins) of coating compositions of the invention may comprise one or more repeat units of the following Formula (1):

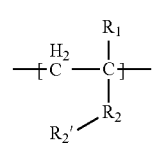

(1)

wherein in formula (I):

$R_1$ is selected from hydrogen, halogen, cyano, optionally substituted alkyl including optionally substituted cycloalkyl;

$R_2$ is a linking group selected from —C(=O)—O—, —O—, —(CH$_2$)$_n$—O—, —O—(CH$_2$)$_n$— where n is a positive integer such as 1-6, —(CH$_2$)$_n$— where n is a positive integer such as 1-6, -(optionally substituted carbocyclic aryl)-O—, -(optionally substituted carbocylic aryl)-, —O-(optionally substituted carbocyclic aryl)-, -(optionally substituted heteroaryl)-O—, -(optionally substituted heteroaryl)-, —O-(optionally substituted heteroaryl)-; and $R_{2'}$ is selected from optionally substituted $C_1$ to $C_{12}$ linear, branched or cyclic alkyl, optionally substituted $C_6$ to $C_{15}$ aryl, optionally containing heteroatoms, and wherein $R_{2'}$ comprises at least one epoxy group, or $R_2$ and $R_{2'}$ are taken together to form a carbon alicyclic ring that comprises a pendant or fused epoxy group.

Particularly suitable epoxy reactive resins (first resins) of coating compositions of the invention may comprise: (1) optionally one or more repeat units of the following Formula (2):

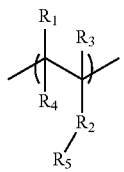

(2)

wherein in Formula (2):

$R_1$ is selected from hydrogen, halogen, cyano, optionally substituted alkyl including optionally substituted cycloalkyl;

$R_2$ is a linking group selected from —C(=O)—O—, —O—, —(CH$_2$)$_n$—O—, —O—(CH$_2$)$_n$— where n is a positive integer, —(CH$_2$)$_n$— where n is a non-negative integer, -(optionally substituted carbocyclic aryl)-O—, -(optionally substituted carbocyclic aryl)-, —O-(optionally substituted carbocyclic aryl)-, -(optionally substituted heteroaryl)-O—, -(optionally substituted heteroaryl)-, —O-(optionally substituted heteroaryl)-;

$R_3$ is selected from hydrogen, halogen, cyano, and optionally substituted alkyl; and $R_4$ and $R_5$ are independently selected from hydrogen, optionally substituted alkyl, optionally substituted carbocyclic aryl, or optionally substituted heteroaryl;

or $R_2$ and $R_5$ are taken together to form a carbon alicyclic ring that comprises a pendant or fused epoxy group; and (2) a unit of the following Formula (3):

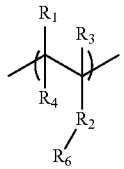

(3)

wherein in Formula (3) $R_1$, $R_2$, $R_3$, and $R_4$ are the same as defined in Formula (2) above; and $R_6$ is optionally substituted alkyl, optionally substituted cyclic alkyl, and optionally substituted carbocyclic aryl, optionally substituted heteroaryl, wherein $R_6$ has at least one functional group that comprises a nucleophilic oxygen, nitrogen or sulfur such a hydroxyl, amine, or thio moiety or a protected form thereof.

Preferred epoxy reactive resins (first resins) of coating compositions of the invention also include those that comprise a unit of the following Formula (4):

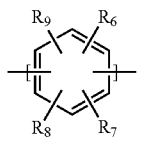

(4)

wherein in Formula (4) $R_6$, $R_7$, $R_8$, and $R_9$ are each independently selected from hydrogen, optionally substituted alkyl, optionally substituted alkenyl, optionally substituted alkynyl group, optionally substituted alkoxy, optionally substituted cycloalkenyl group, optionally substituted $C_2$ to $C_{20}$ heterocycloalkyl, optionally substituted $C_2$ to $C_{20}$ heterocycloalkenyl, optionally substituted heterocycloalkynyl group, optionally carbocyclic aryl or optionally substituted heteroaryl, and where at least one of $R_6$, $R_7$, $R_8$, and $R_9$ comprises has at least one functional group that comprises a nucleophilic oxygen, nitrogen or sulfur such a hydroxyl, amine, or thio moiety or a protected form thereof.

Preferred epoxy reactive resins (first resins) of coating compositions of the invention include materials that comprise polyester linkages, such as a polyester prepared by condensation of monomers comprising 1) cyanurate groups and optionally 2) hydrophobic groups, 3) aromatic groups.

In certain aspects, preferred epoxy reactive resins (first resins) comprise cyanurate groups. Such preferred may be polyesters or have other backbone linkages.

Suitable cyanurate monomers that may be reacted to form a resin (such as an epoxy reactive resin or first resin) of a coating composition of the invention include those of the following Formula (5):

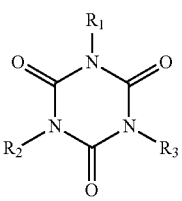

(5)

wherein in Formula (5):

$R_1$, $R_2$ and $R_3$ are each independently hydrogen or non-hydrogen substituent such as optionally substituted alkyl, optionally substituted alkenyl or optionally substituted alkynyl, optionally substituted cyclic alkyl, and optionally substituted carbocyclic aryl, optionally substituted heteroaryl, optionally substituted alkylester, optionally substituted alkyl ether wherein at least one of $R_1$, $R_2$, $R_3$ has functional group that comprises a nucleophilic oxygen, nitrogen or sulfur such a hydroxyl, amine, or thio moiety or a protected form thereof.

Suitable hydrophobic monomers that may be reacted to form a resin (such as an epoxy reactive resin or first resin) of a coating composition of the invention include those of the following Formula (6):

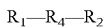

$R_1$—$R_4$—$R_2$ (6)

wherein in Formula (6):

$R_1$ and $R_2$ are the same as defined in Formula (5) wherein at least one of $R_1$, $R_2$ has functional group that comprises a nucleophilic group that comprises oxygen, nitrogen or sulfur such as hydroxyl, carboxyl, amine, or thio moiety; R4 is optionally substituted alkyl (e.g. optionally substituted $C_{1-10}$ alkyl), optionally substituted alkenyl or optionally substituted alkynyl preferably having 2 to about 10 carbon atoms such as allyl or optionally halogenated alkyl;

Suitable aromatic (including carbocyclic aryl) monomers that may be reacted to form a resin (such as an epoxy reactive resin or first resin) of a coating composition of the invention include those of the following Formula (7):

$R_1$—Ar—$R_2$ (7)

wherein in Formula (7):

$R_1$ and $R_2$ are the same as defined in Formula (5) wherein at least one of $R_1$ and $R_2$ has functional group that comprises a nucleophilic group that comprises an oxygen, nitrogen or sulfur such as hydroxyl, carboxyl, amine, or thio moiety; aromatic group is optionally substituted alkaryl such as optionally substituted benzyl, optionally substituted carbocyclic aryl such as optionally substituted phenyl, naphthyl, anthrathyl, acenaphthyl, or optionally substituted heteroaromatic group such as metylphthalimide, N-methyl-1,8-phthalimide.

For antireflective applications, underlying compositions of the invention also preferably contain a component that comprises chromophore groups that can absorb undesired radiation used to expose the overcoated resist layer from reflecting back into the resist layer. The resin or crosslinker may comprise such chromophore groups, or a coating composition may comprise a further component that comprises suitable chromophore groups.

Preferred first resins may be fluorinated, i.e. comprise or more atoms that have fluorine substitution, including substitution by a fluorinated alcohol. Preferred second resins may be fluorinated, i.e. comprise or more atoms that have fluorine substitution, including substitution by a fluorinated alcohol. Preferred coating compositions include those where the first resin is fluorinated, but the second resin does not have any fluorine substitution. Preferred coating compositions include those where the second resin is fluorinated, but the first resin does not have any fluorine substitution. Preferred coating compositions also include those where both the first resin and second resin are fluorinated.

In use with an overcoated photoresist, a coating composition may be applied on a substrate such as a semiconductor wafer which may have one or more organic or inorganic coating layers thereon. The applied coating layer may be optionally thermally treated prior to overcoating with a photoresist layer. Such thermal treatment may cause hardening including crosslinking of the coating composition layer. Such crosslinking may include hardening and/or covalent-bonding forming reactions between one or more composition components and can modulate water contact angle of the coating composition layer.

Thereafter, a photoresist composition may be applied over the coating composition layer followed by imaging of the applied photoresist composition layer with patterned activating radiation and the imaged photoresist composition layer is developed to provide a photoresist relief image.

A variety of photoresists may be used in combination (i.e. overcoated) with a coating composition of the invention. Preferred photoresists for use with the underlying coating compositions of the invention are chemically-amplified resists, especially negative-tone photoresists that contain one or more photoactive compounds and a resin component that contains units that undergo a deblocking or cleavage reaction in the presence of photogenerated acid.

In preferred aspects, the photoresist composition is designed for a negative-tone resist where the light-exposed regions remains after development process, but positive tone development can be also employed to remove the exposed portions of the photoresist layer.

The invention further provides methods for forming a photoresist relief image and novel articles of manufacture comprising substrates (such as a microelectronic wafer substrate) coated with a coating composition of the invention alone or in combination with a photoresist composition.

Other aspects of the invention are disclosed infra.

BRIEF DESCRIPTION OF THE DRAWINGS

FIG. 1A is a SEM of the processed composition of Comparative Example 6, and FIG. 1B is a SEM of the processed composition of Example 7.

FIG. 2A is a SEM of the processed composition of Comparative Example 6, and FIG. 2B is a SEM of the processed composition of Example 8.

DETAILED DESCRIPTION

Figure 1A:
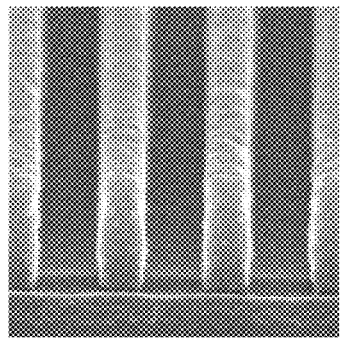
FIGS. 1A and 1B show results of Example 15 which follows.

As discussed above, organic coating compositions, particularly antireflective compositions for use with an overcoated photoresist, are provided that comprise a blend of two distinct resins: 1) a first resin that comprises one or more epoxy reactive groups; and 2) a crosslinker resin that is distinct from the first resin and comprises epoxy groups.

The blend of resins are suitably distinct or separate (e.g. the two or more resins are not covalently linked) before any thermal treatment or crosslinking of a composition comprising the resins. The blends of resins suitably may be the same type (e.g. where blend members are each acrylate or are each polyesters) or the blend of resins may be different (e.g. where a first resin that comprises epoxy reactive groups is an acrylate and the second distinct resin that comprises epoxy groups is other than an acrylate such as a polyester, or where the first resin is a polyester and/or comprises cyanurate groups and the second resin does not comprise cyanurate groups and/or polyester linkages).

As feature size becomes smaller and substrate topography becomes more complex with efforts to design more functional circuits, controlling the variation in critical dimension (CD) caused by the reflection of light from highly reflective substrates, interference of multiple layers of thin films, and photoresist depth of focus (DOF) is more critical. For such applications, BARC and gap-fill materials can be applied on substrates of relatively huge topography.

We have found that for such regions of topography BARC materials should provide a coating of reduced thickness bias between the areas of isolated-via and dens-via, have a higher etch rate than resist, and be essentially void free and have essentially no intermixing with resists. However, prior BARC materials can produce voids, particularly inside hole and trench patterns having for example 10 nm or less dimensions. Voids can cause numerous performance issues, including variations in BARC top thickness, optical properties, via fill percentage, and plasma etch rate.

We have now found that the present preferred underlying coating compositions can exhibit notable improved gap fill performance, including with small dimension hole and trench patterns. In preferred aspects, coating compositions of the invention can coat trenches without detection of voids (SEM analysis) where the trenches have dimensions of 40, 30, 20, or 10 nm or less and pitches of 80, 90, 100, 110 or 120 nm or more.

Without being bound by any theory, it is believed the present preferred coating compositions have a crosslinking reactivity and efficiency that controls polymer thermal flow and effectiveness to thereby positively impact gap fill performance. In particular, preferred coating compositions of the invention have relatively high crosslinking temperatures which is believed can provide the composition polymers time sufficient to flow to via bottom surfaces.

Preferred coating compositions of the invention also can exhibit reduced film shrinkage relative to prior compositions. In particular, preferred coating compositions do not generate any substantial by-products (e.g. cleavage reaction products) so shrinkage of the composition coating film during crosslinking does occur in significant amounts. Reduction of film thickness loss also can enhance performance and resist resolution.

Exemplary preferred first resins that comprise one more epoxy reactive groups also may include isocyanuarate such as polymers of the following Formula (8):

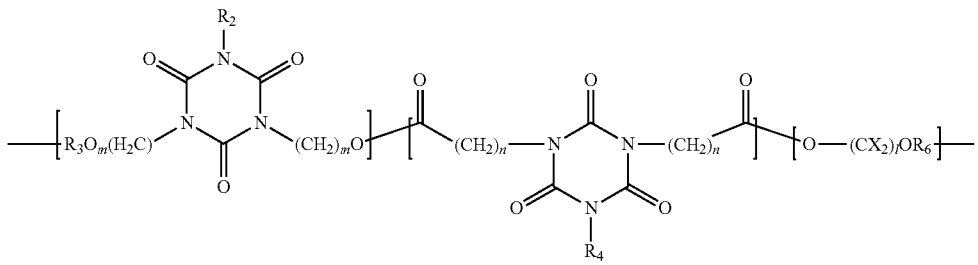

(8)

Wherein in formula (8) $R_2$ and $R_4$ are each independently hydrogen or non-hydrogen substituent such as optionally substituted alkyl (e.g. optionally substituted $C_{1-10}$ alkyl), optionally substituted alkenyl or alkynyl preferably having 2 to about 10 carbon atoms such as such as allyl, optionally substituted alkanoyl preferably having 1 to about 10 carbon atoms; optionally substituted alkoxy (including epoxy) preferably having 1 to about 10 carbon atoms such as methoxy, propoxy, butoxy; optionally substituted alkylthio preferably having 1 to about 10 carbon atoms; optionally substituted alkylsulfinyl preferably 1 to about 10 carbon atoms; optionally substituted alkylsulfonyl preferably having 1 to about 10 carbon atoms; optionally substituted carboxy preferably have 1 to about 10 carbon atoms (which includes groups such as —COOR' where R' is H or $C_{1-8}$alkyl, including esters that are substantially non-reactive with photoacid); optionally substituted alkaryl such as optionally substituted benzyl, optionally substituted carbocyclic aryl such as optionally substituted phenyl, naphthyl, acenaphthyl, or optionally substituted heteroalicyclic or heteroaromatic group such as methylphthalimide, N-methyl-1,8-phthalimide, with at least one or $R_2$ and $R_4$ comprising a nucleophilic oxygen, nitrogen or sulfur such a hydroxyl, amine, or thio moiety or a protected form thereof.

$R_3$ and $R_6$ are the same or different linkers such as optionally substituted alkylene e.g. —$(CH_2)_n$— where n is an integer of 1 to 6;

each m, n and 1 are the same or different and are 0 or a positive integer, typically 0, 1, 2, 3, 4, or 5.

Exemplary preferred polymers of the compositions that may comprise an epoxy reactive group and an isocyanurate group include the following:

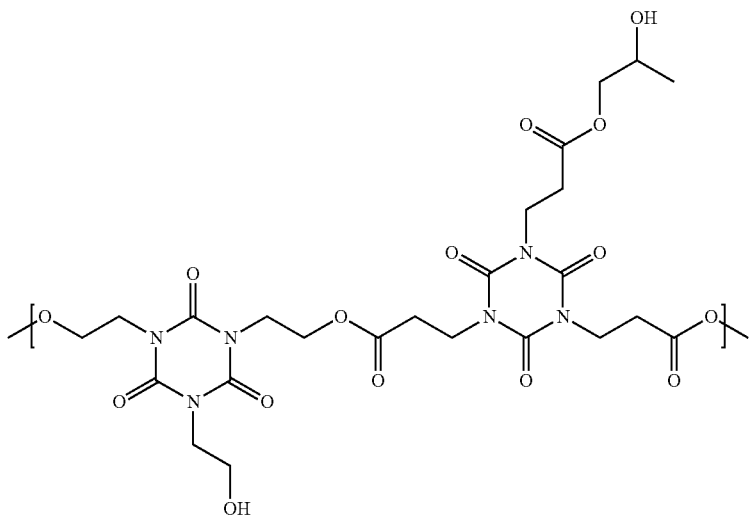

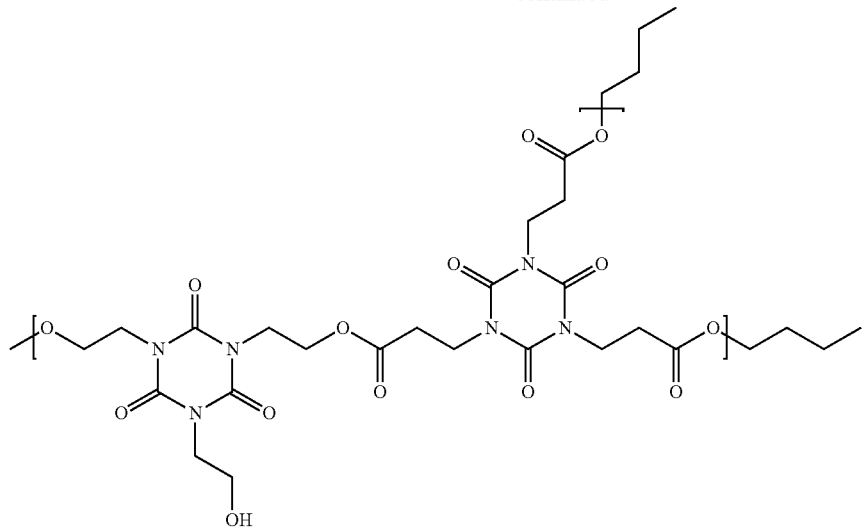
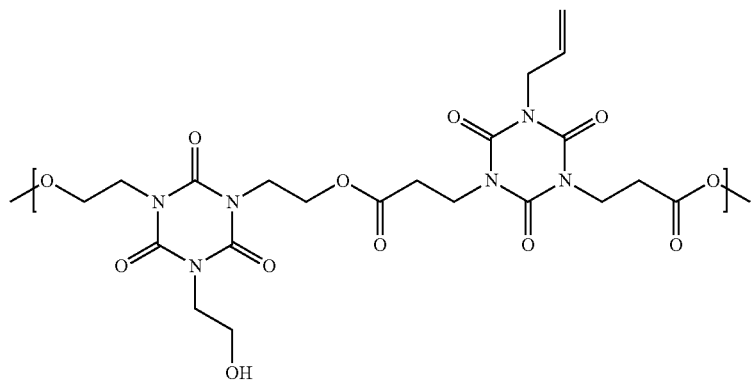
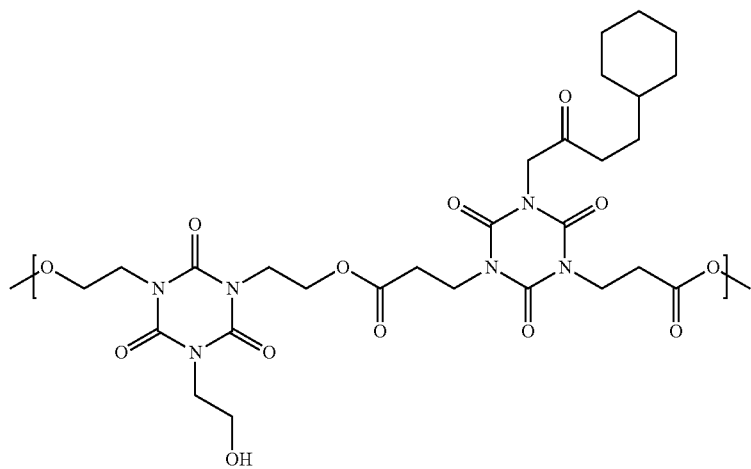

-continued
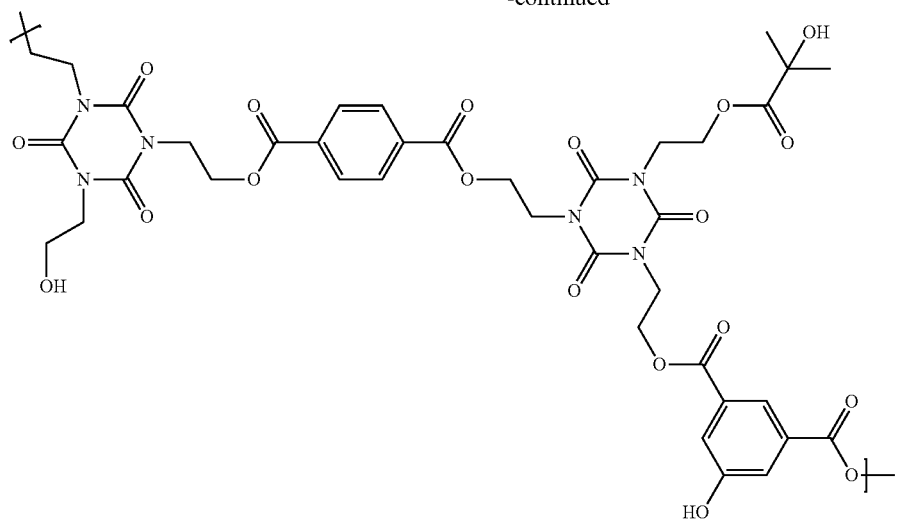
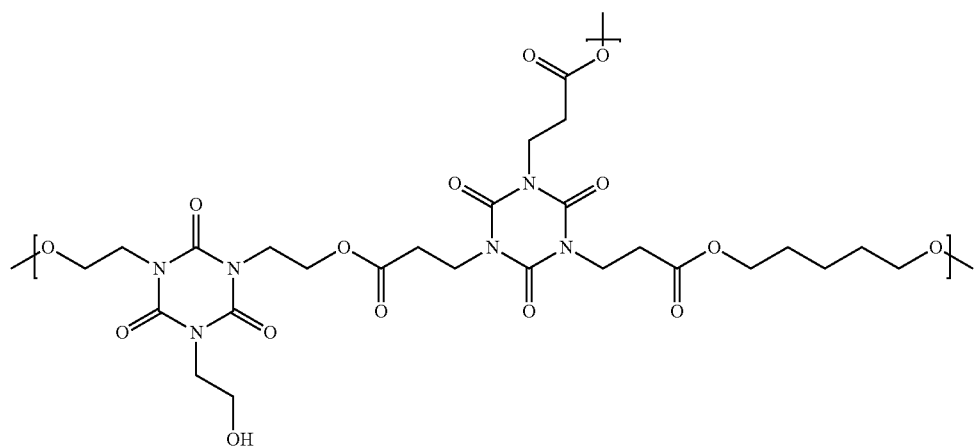
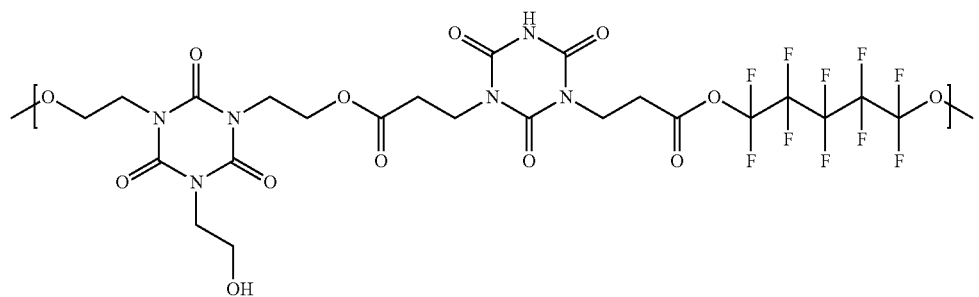
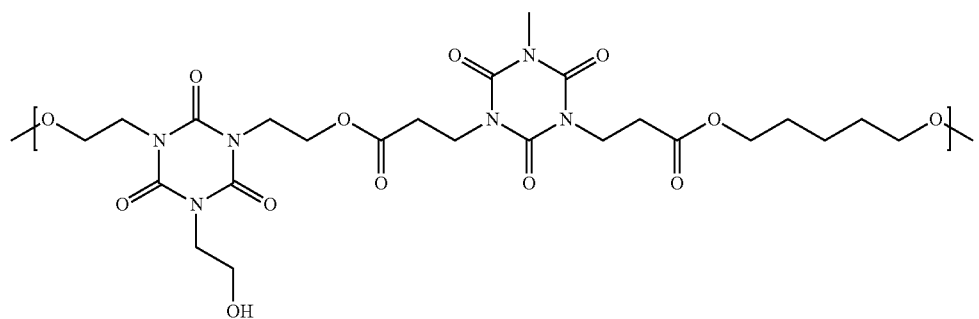

-continued
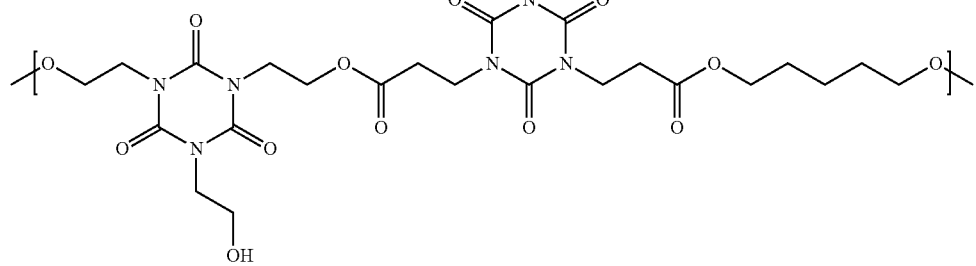
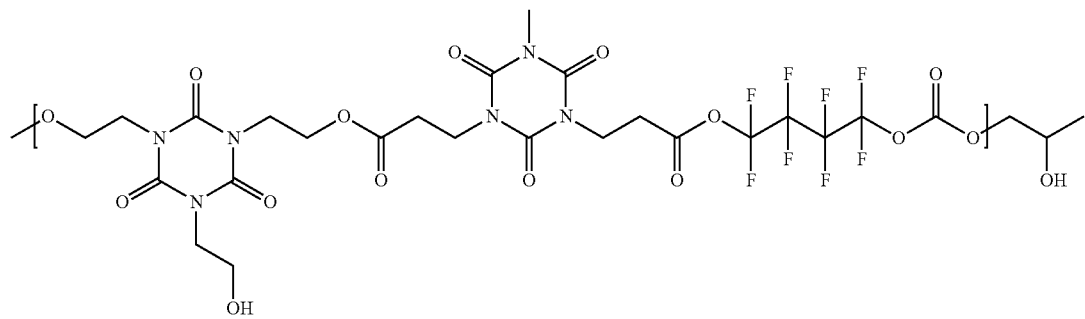
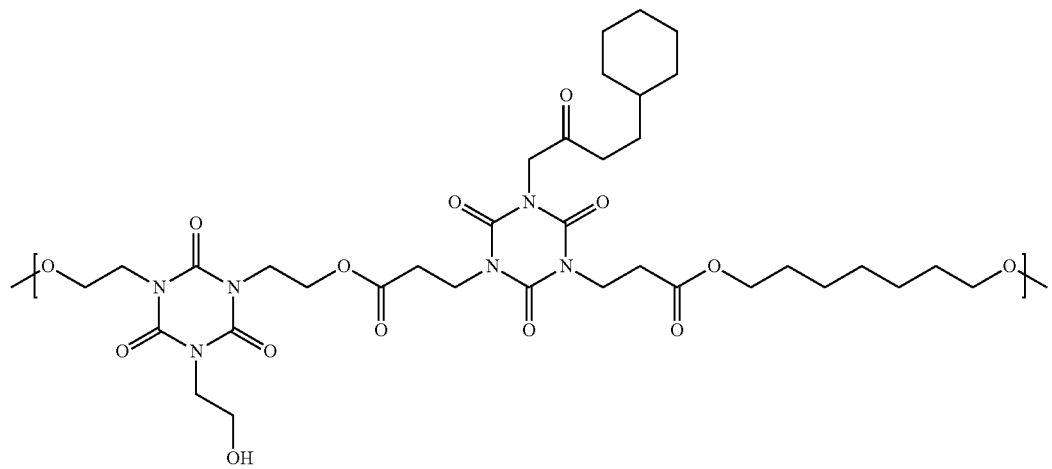
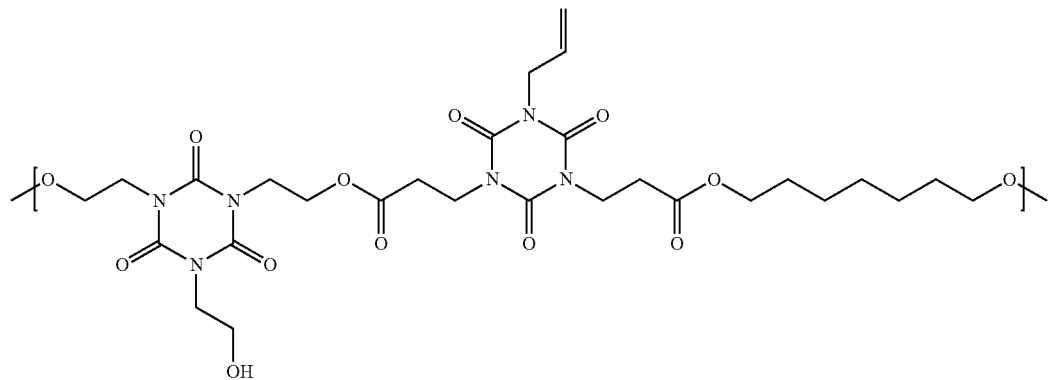

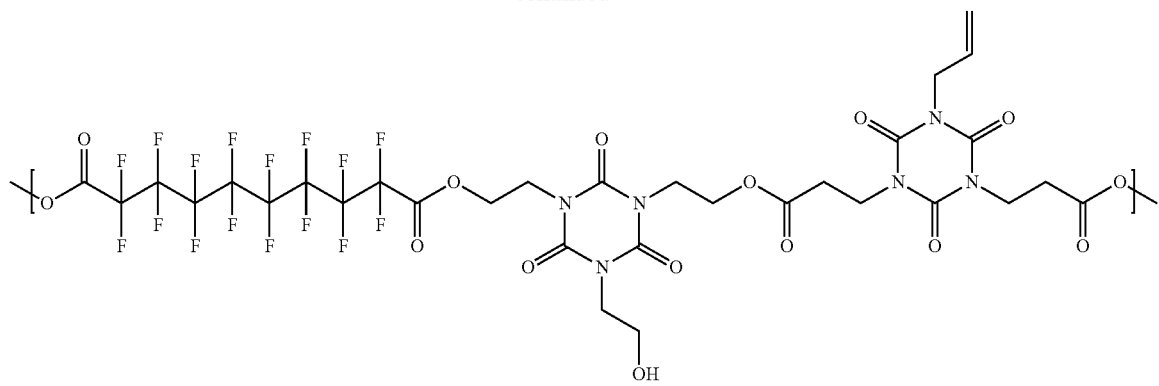
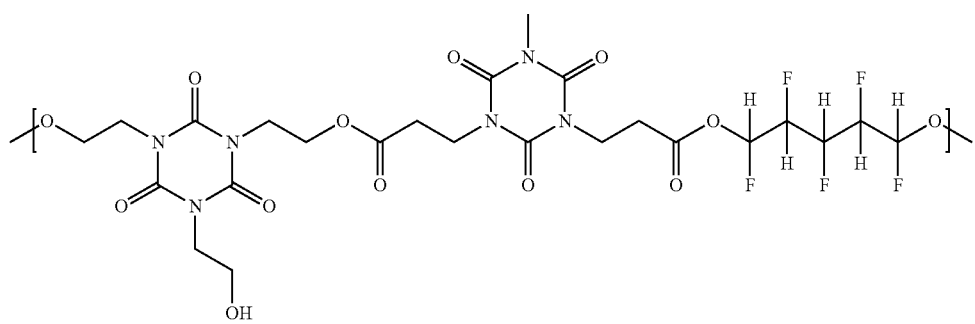
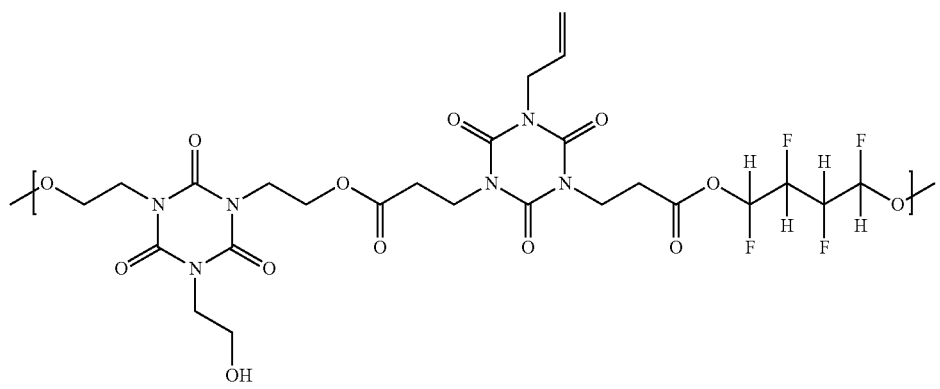
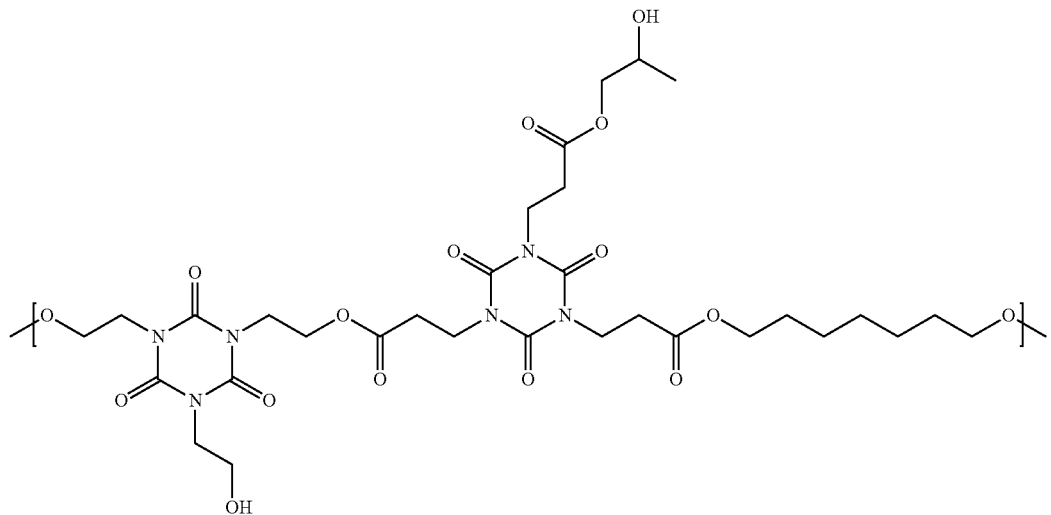

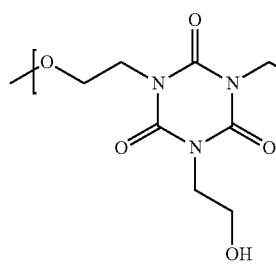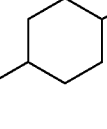
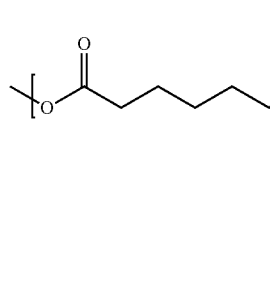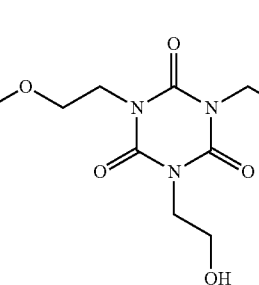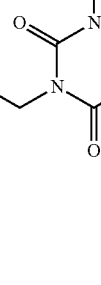
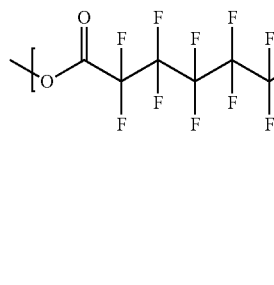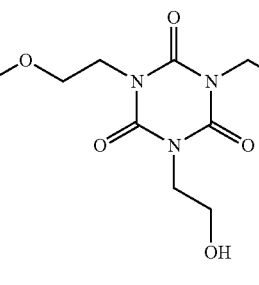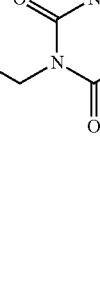
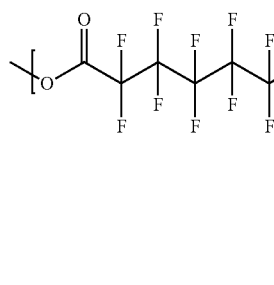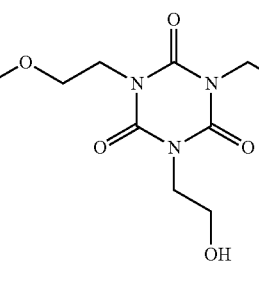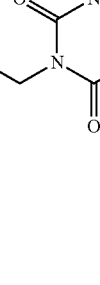

19
-continued
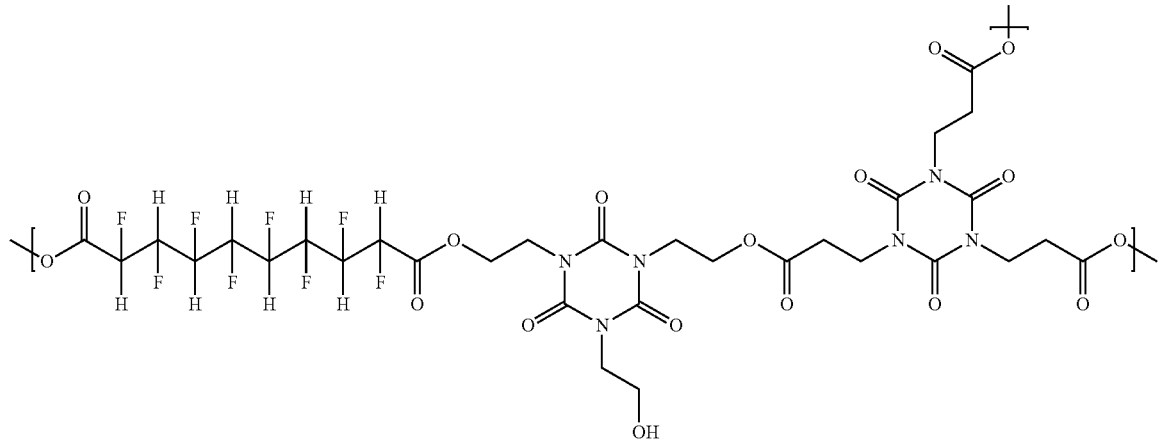
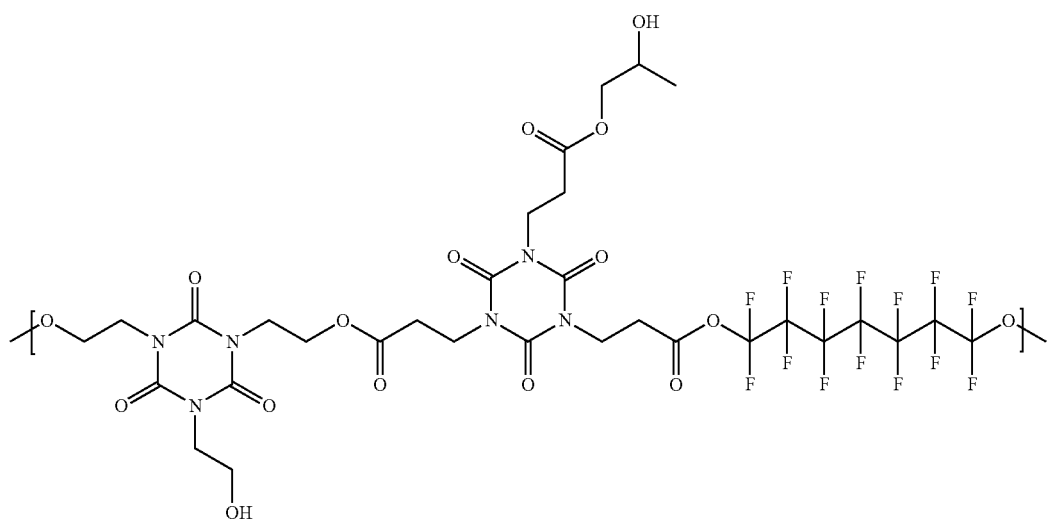
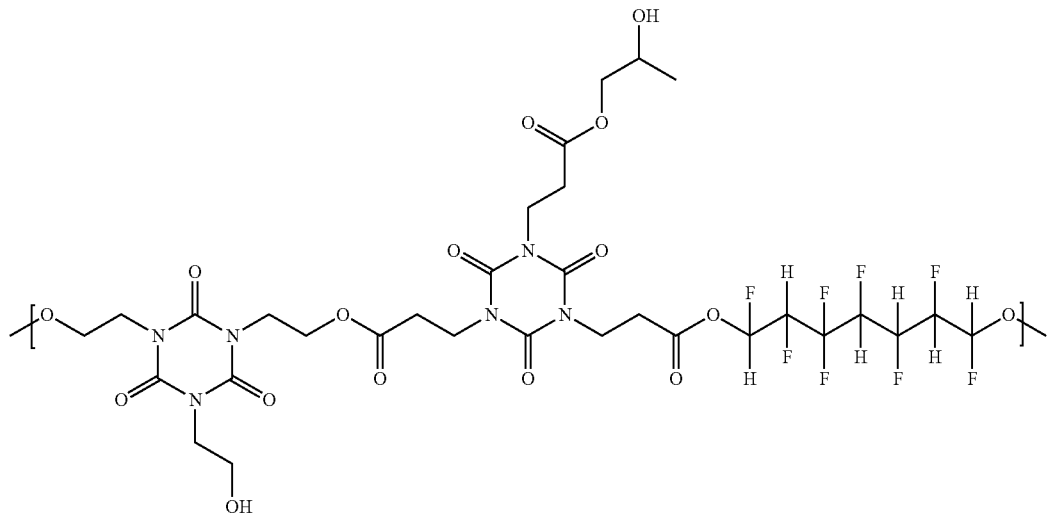

-continued
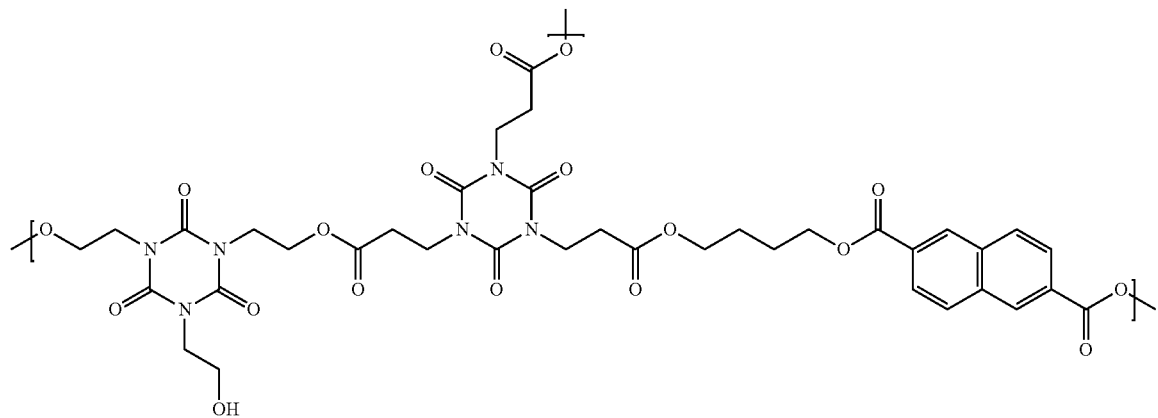
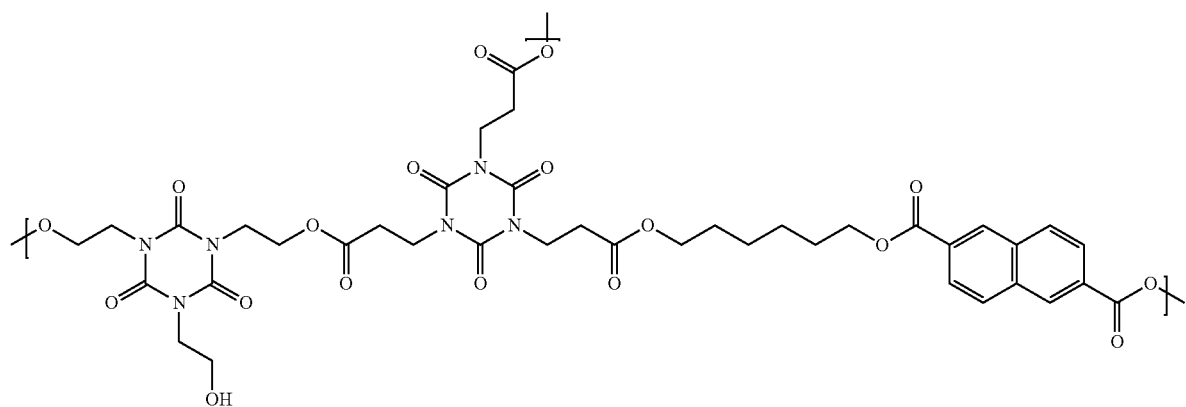
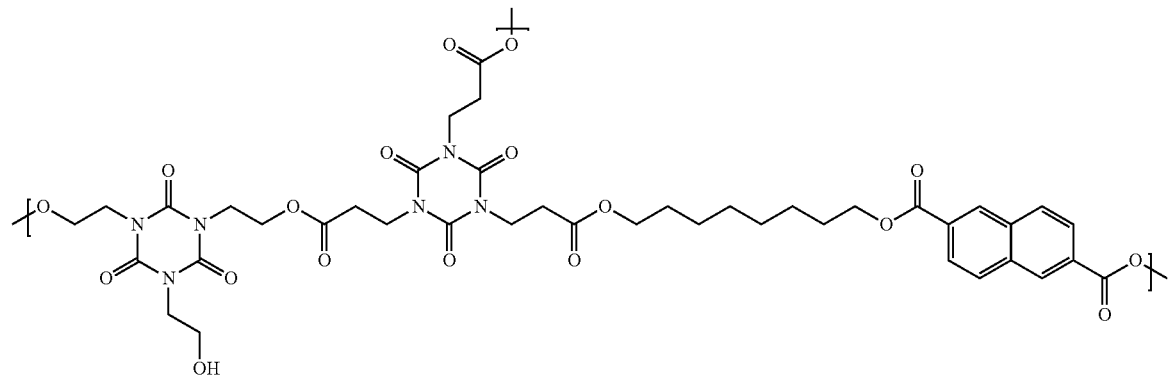
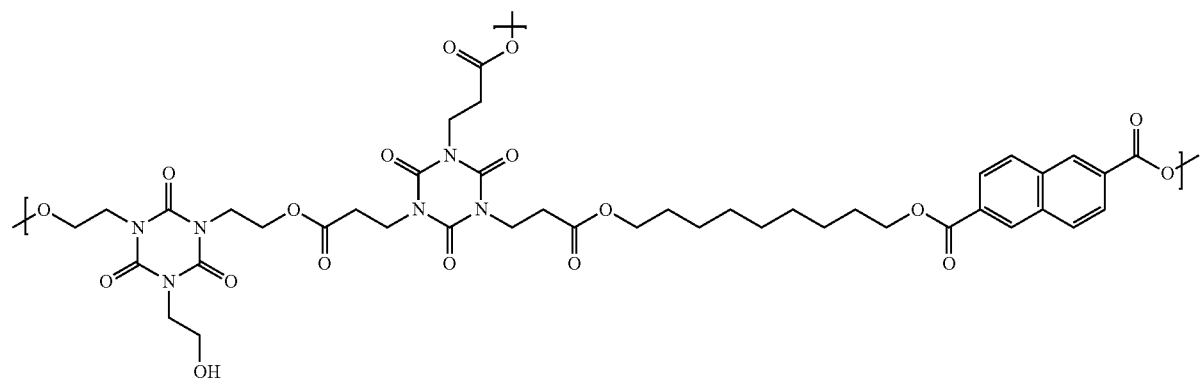

-continued
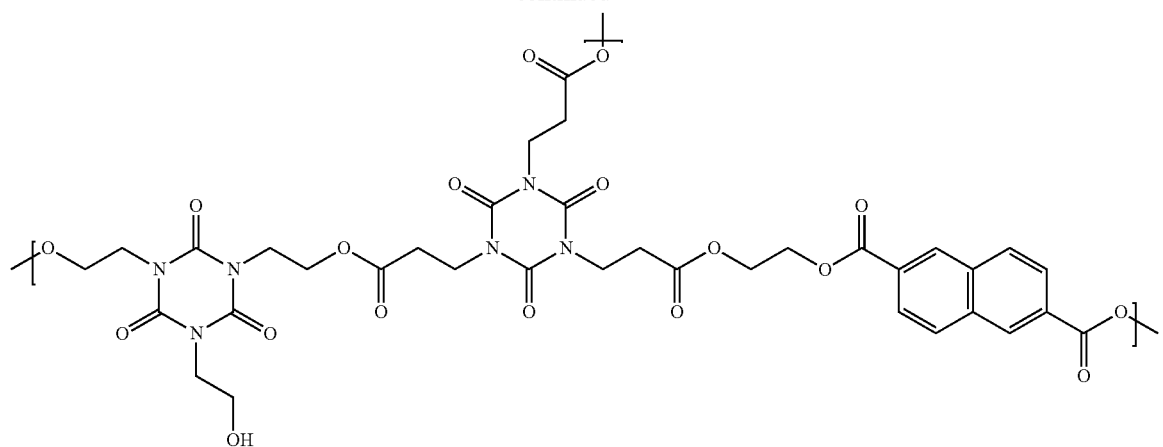
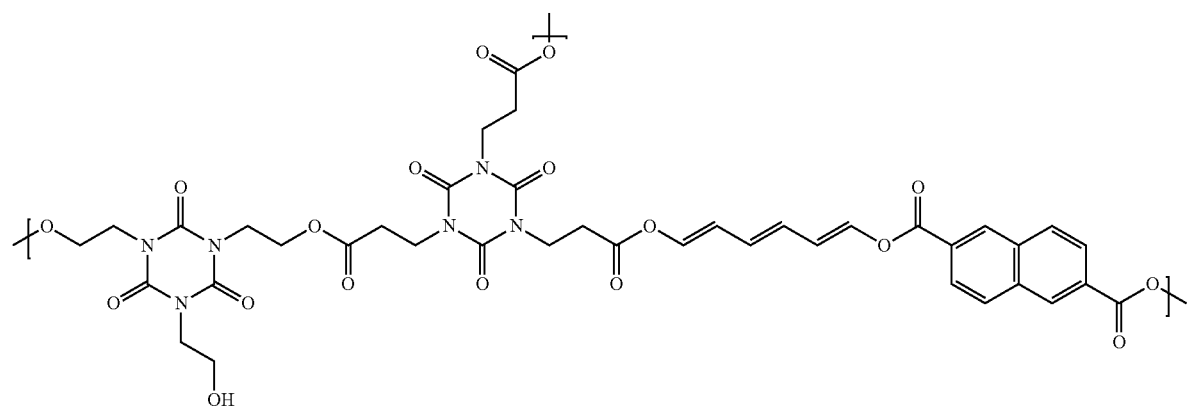
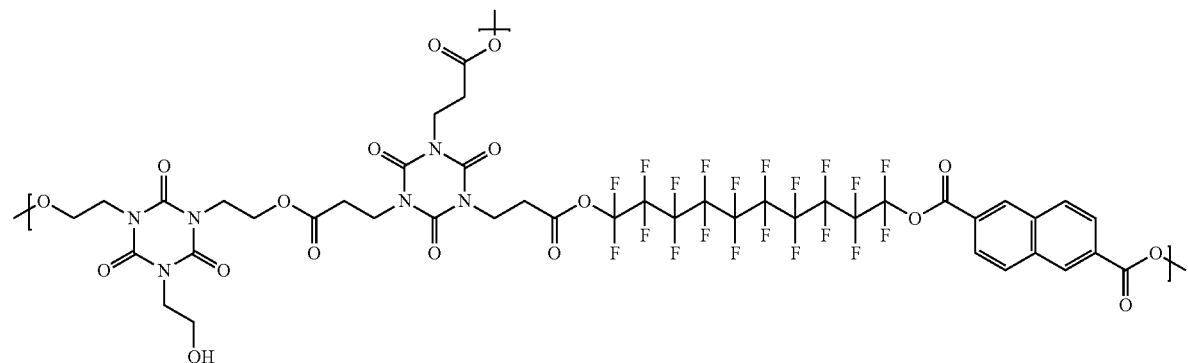
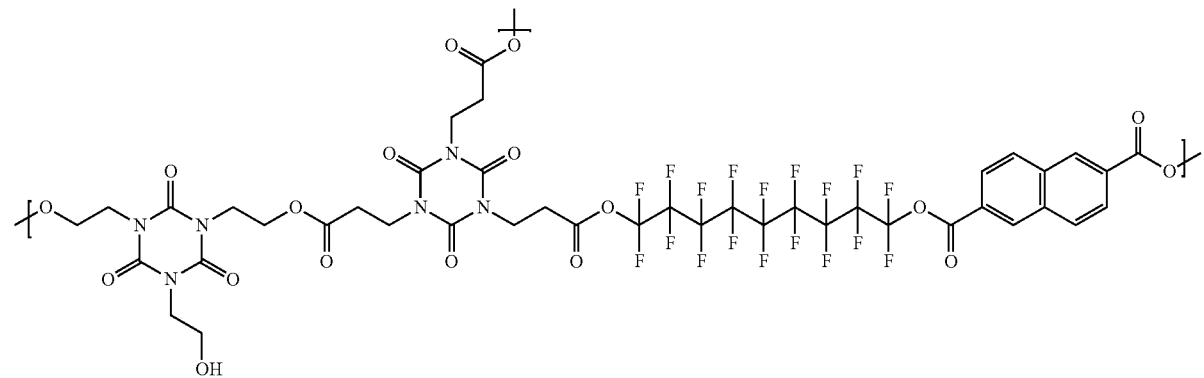

-continued
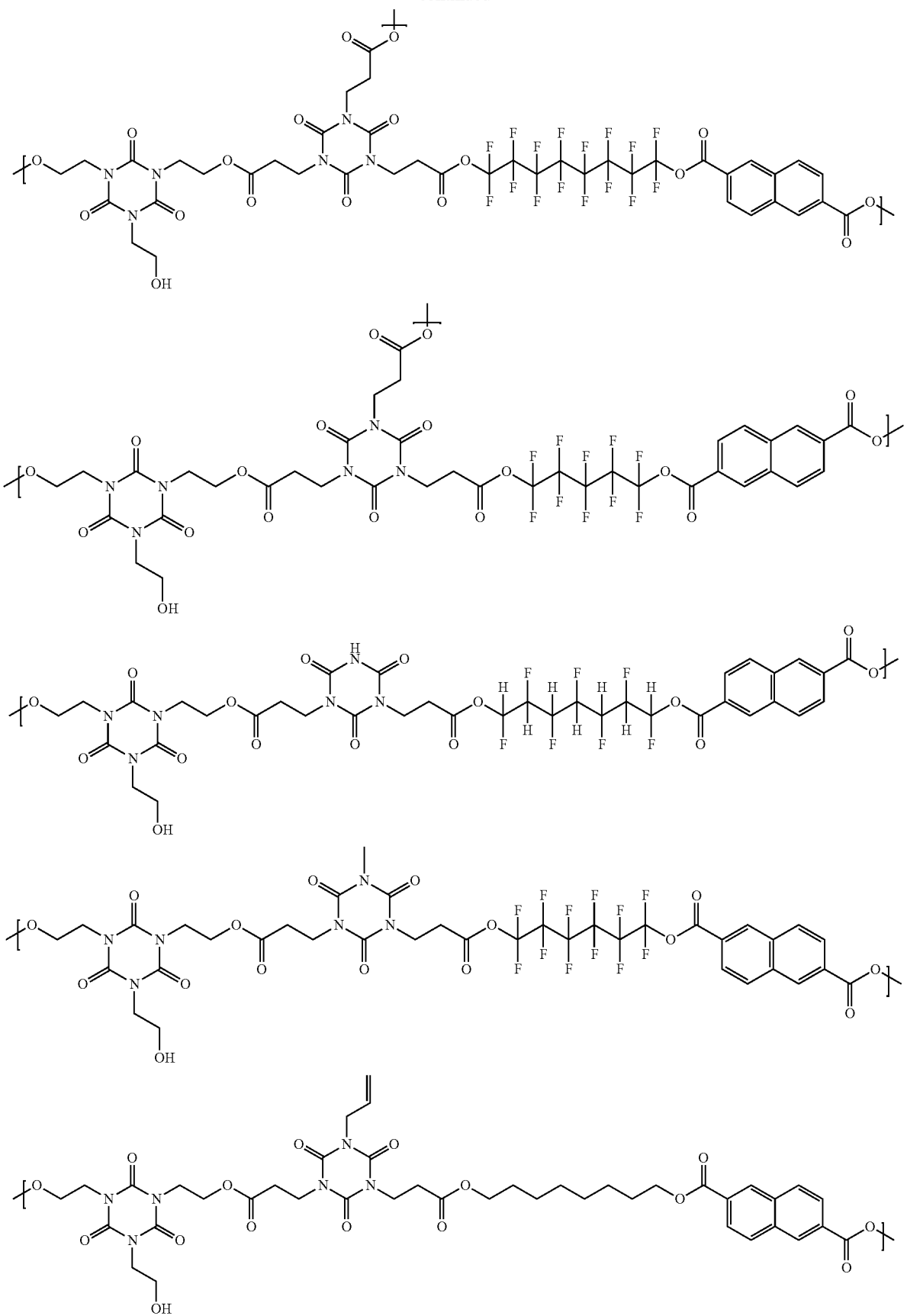

-continued

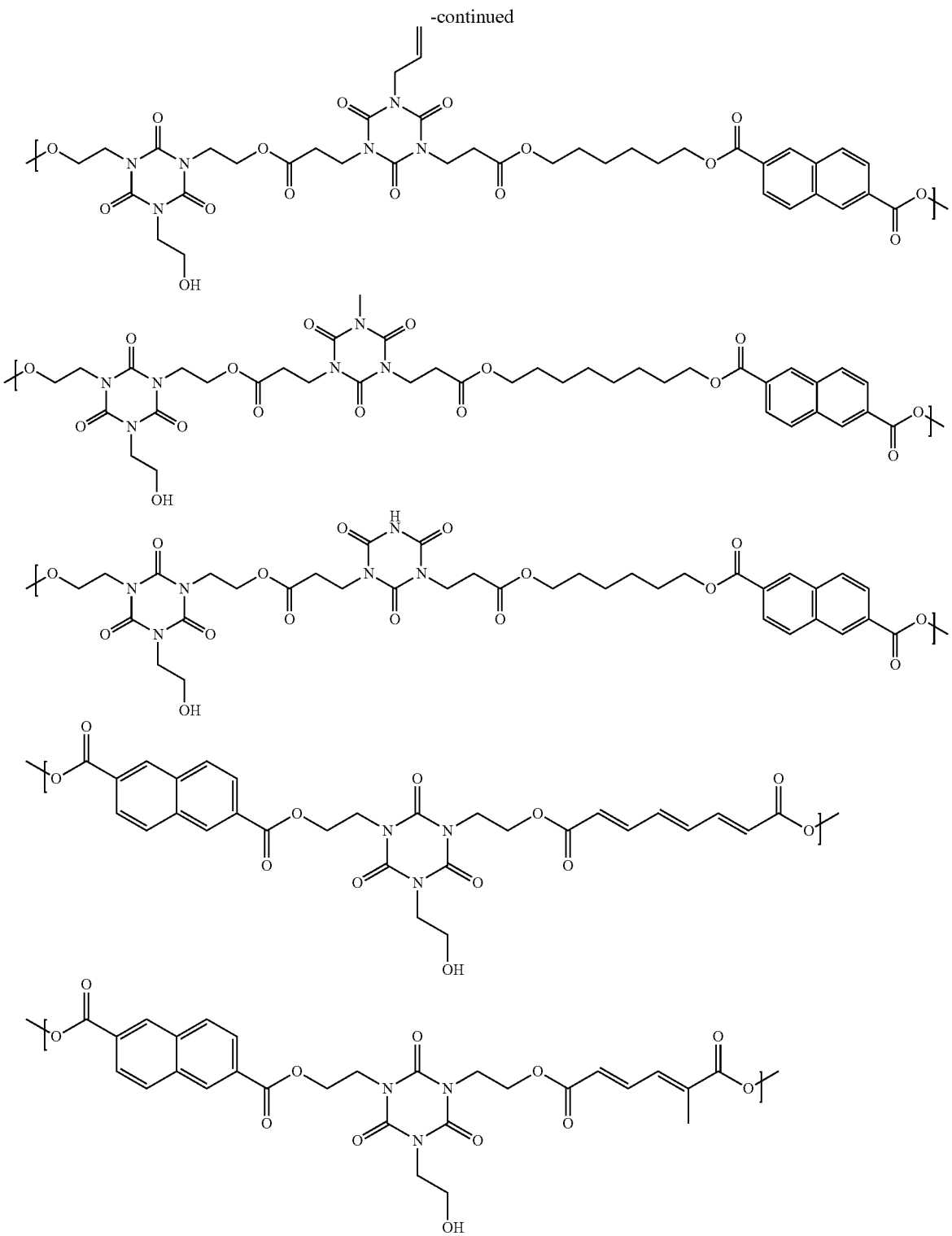

Additional preferred first resins that comprise one more epoxy reactive groups include acrylate resins, polyhydroxystryene resins and other resins that comprise a carbon alicyclic, heteroalicyclic or heteroaromatic group with one or more epoxy reactive group ring substituents, such as resins that comprise, consist essentially of or consist of a structure (repeat units) as set forth below. In the following structures, the values x, y and z designate mole percentage of the specified repeat unit as percent in a resin. Typical values of x, y and z in the following structures range from 0 to 90 percent, where at least one unit that contains an epoxy reactive group will be present in the resin (thus, e.g., a resin unit that contains an epoxy reactive group would have a designated value of x, y or z greater than 0). Suitable values of n in the below structures include 0 and a positive integer, typically 0, 1, 2, 3, 4, 5 or 6, more typically 1, 2, 3, 4, 5 or 6:
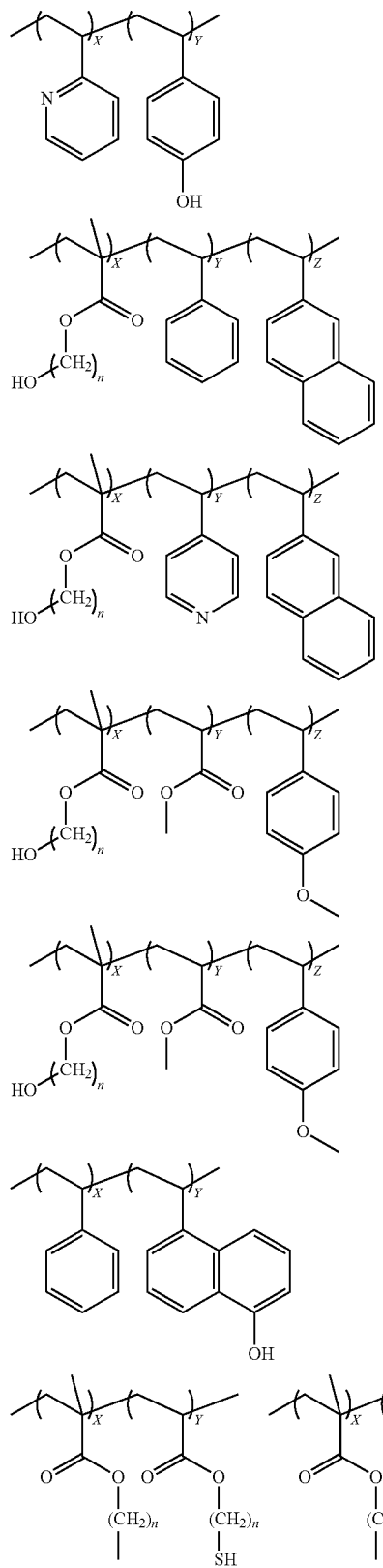
-continued
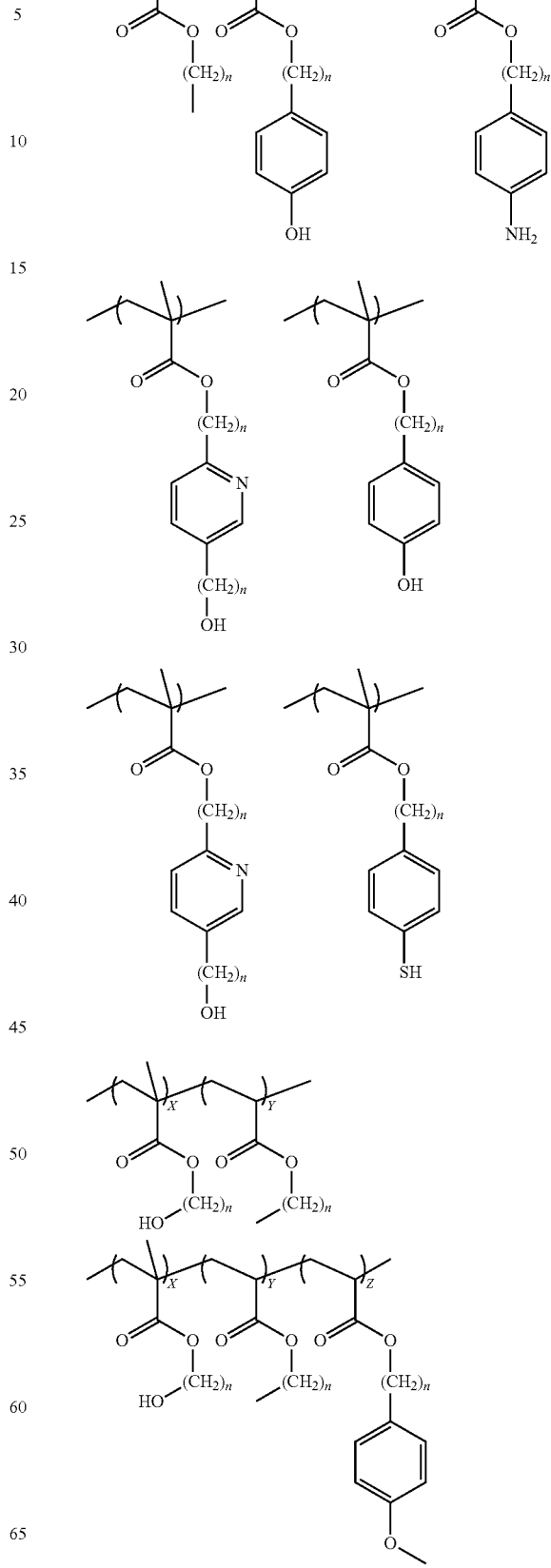

31
-continued
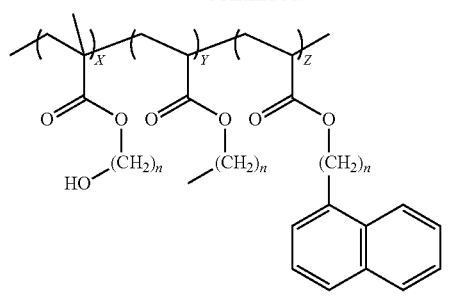
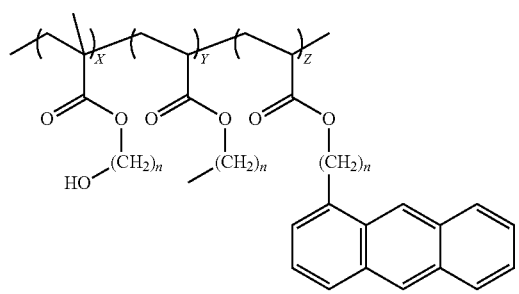
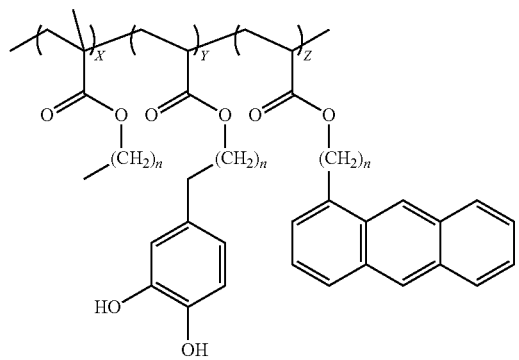
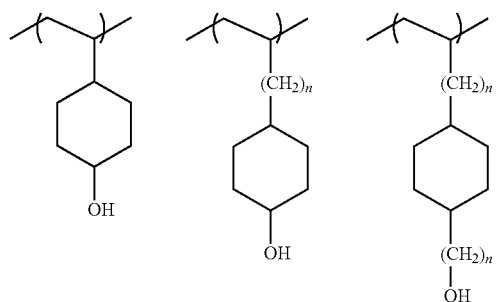
32
-continued
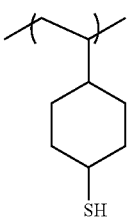 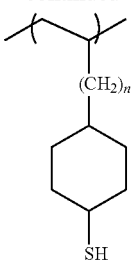 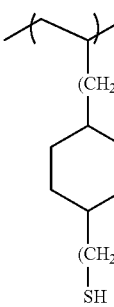
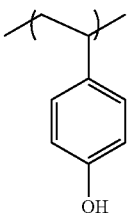 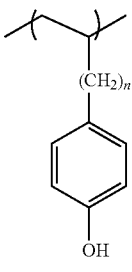 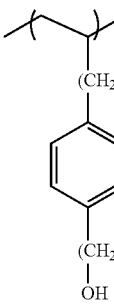
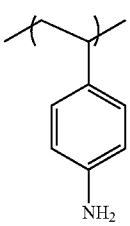 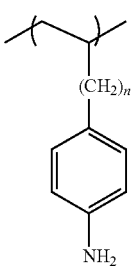 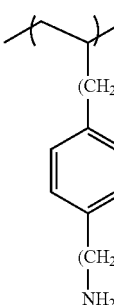
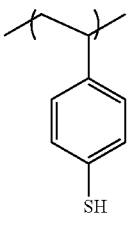 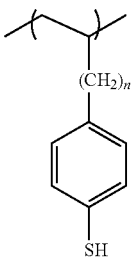 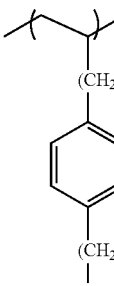
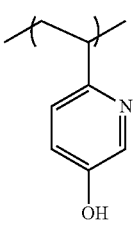 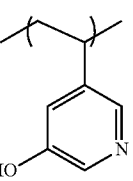 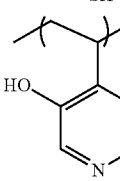
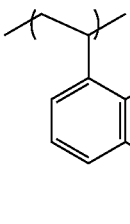 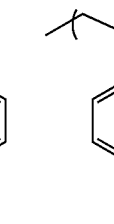 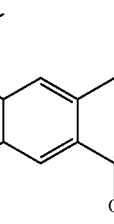

-continued
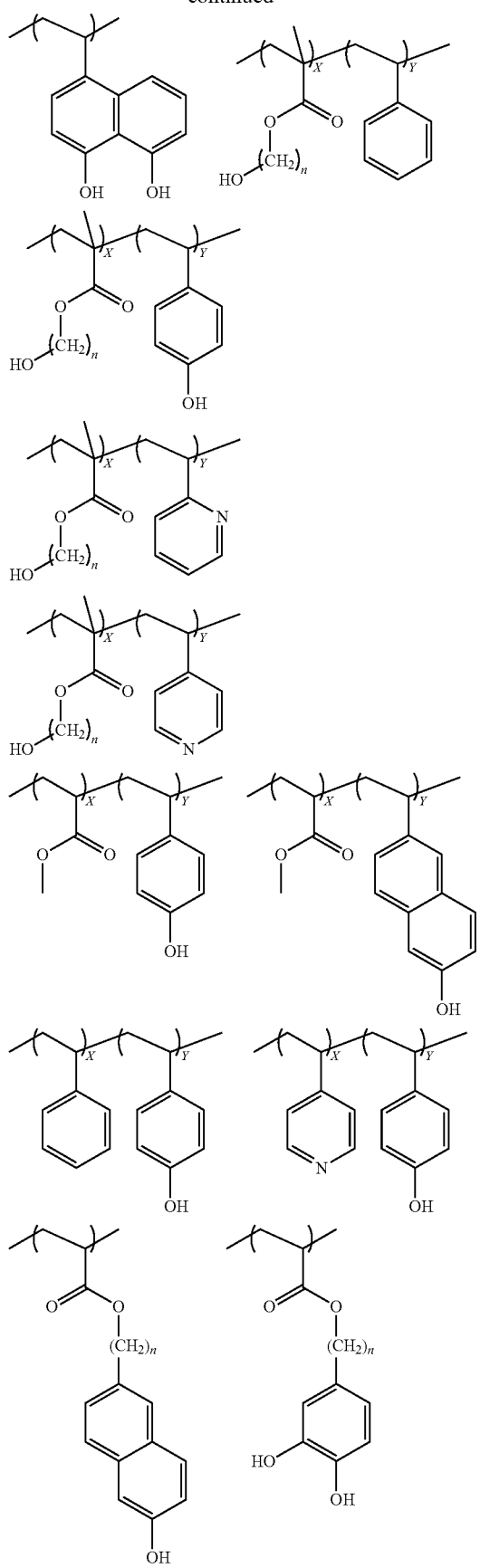
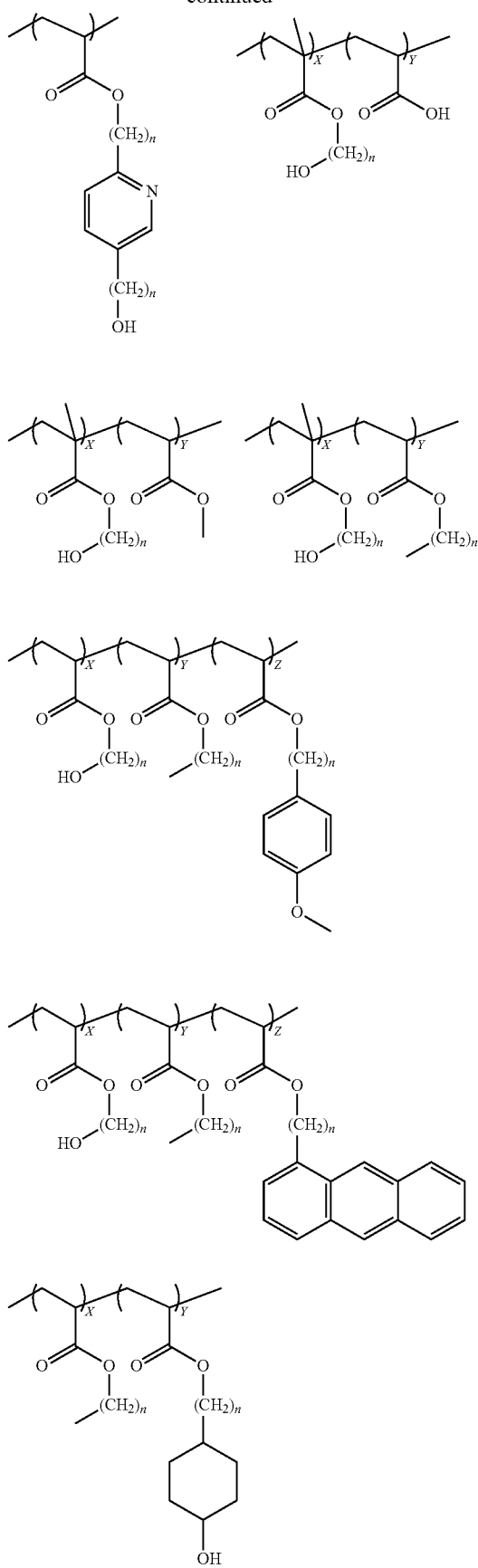

-continued
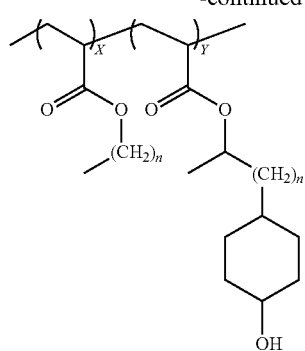
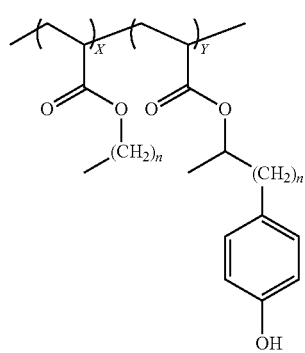
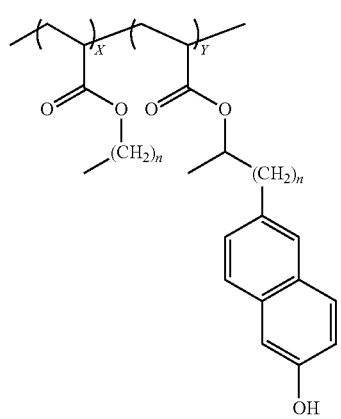
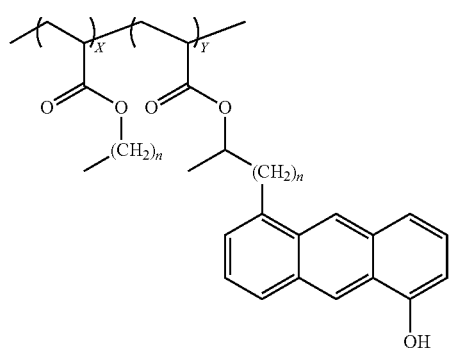
-continued
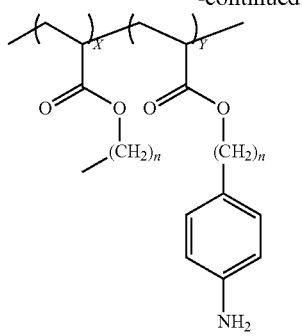
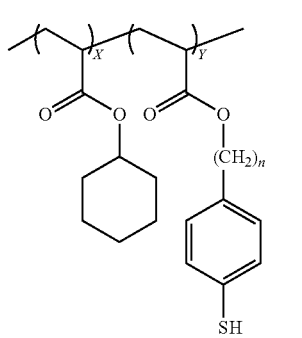
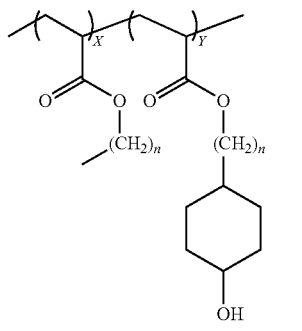
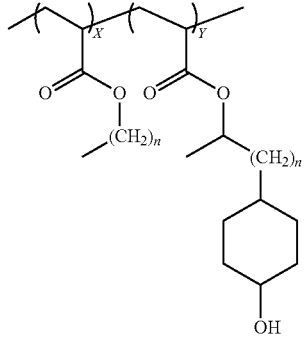
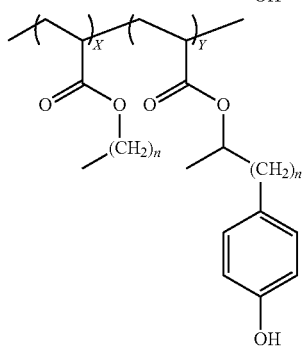

-continued
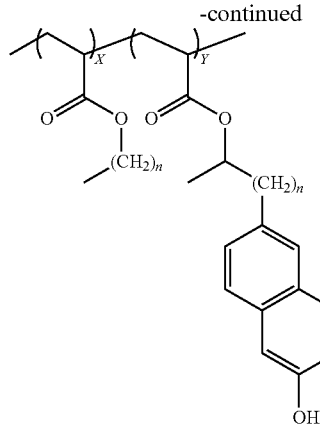
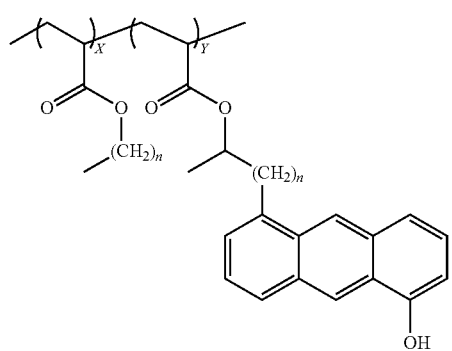
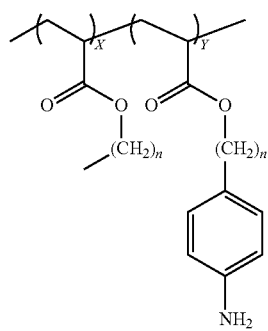
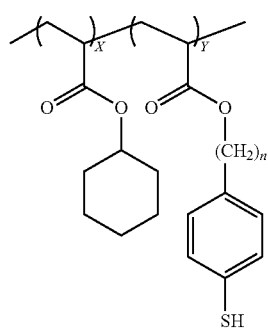
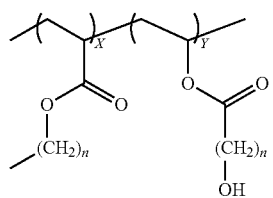
-continued
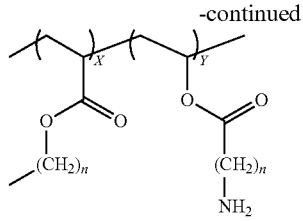
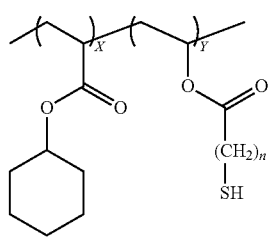
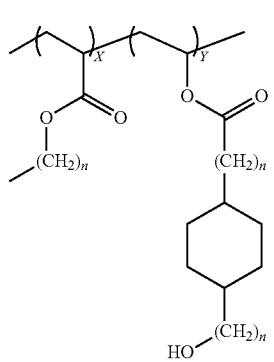
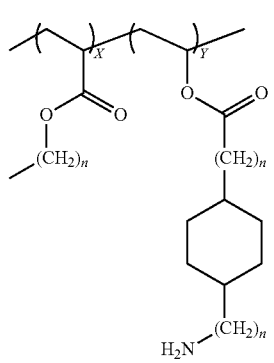
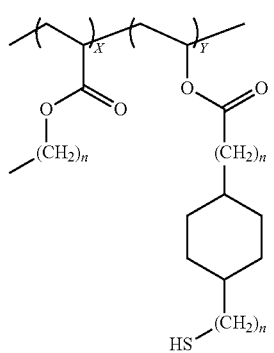

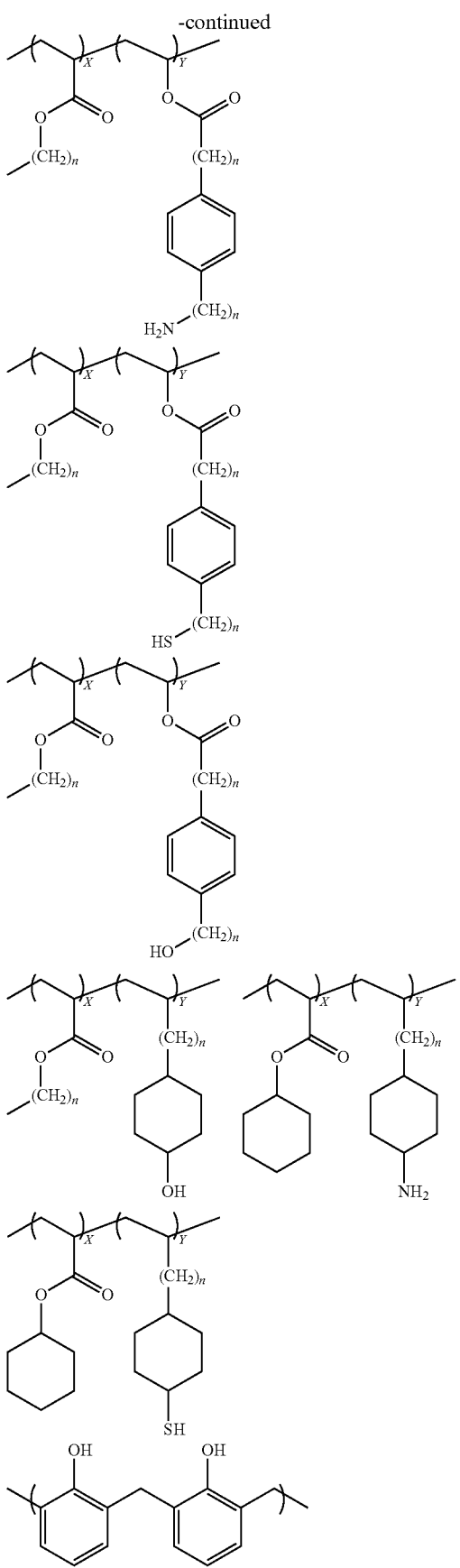

The term "alkyl", as used herein, unless otherwise indicated, includes saturated monovalent hydrocarbon radicals having straight, branched, or cyclic moieties (including fused and bridged bicyclic and spirocyclic moieties), or a combination of the foregoing moieties, which may be interrupted by one or more hetero atoms. Suitable alkyl groups may have 1 to 30 or more carbon atoms. For an alkyl group to have cyclic moieties, the group must have at least three carbon atoms. Terms as such as alkyl ester or alkyl ether are well-understood to designate a group that includes both functional group, i.e. alkyl ether is an alkyl group as specified herein together with an ether group (also an alkoxy group).

The term "alkylene", as used herein, unless otherwise indicated, includes a divalent radical derived from alkyl, as exemplified by —CH$_2$CH$_2$CH$_2$CH$_2$—.

The term "alkenyl", as used herein, unless otherwise indicated, includes alkyl moieties having at least one carbon-carbon double bond wherein alkyl is as defined above and including E and Z isomers of said alkenyl moiety.

The term "alkynyl", as used herein, unless otherwise indicated, includes alkyl moieties having at least one carbon-carbon triple bond wherein alkyl is as defined above.

The term "alkyl", as used herein, unless otherwise indicated, includes saturated monovalent hydrocarbon radicals having straight, branched, or cyclic moieties (including fused and bridged bicyclic and spirocyclic moieties), or a combination of the foregoing moieties, which may be interrupted by one or more hetero atoms. For an alkyl group to have cyclic moieties, the group must have at least three carbon atoms.

The term "alkylene", as used herein, unless otherwise indicated, includes a divalent radical derived from alkyl, as exemplified by —CH$_2$CH$_2$CH$_2$CH$_2$—.

The term "alkenyl", as used herein, unless otherwise indicated, includes alkyl moieties having at least one carbon-carbon double bond wherein alkyl is as defined above and including E and Z isomers of said alkenyl moiety. Heteroalkenyl is an alkenyl group that includes one or more N, O or S atoms.

The term "alkynyl", as used herein, unless otherwise indicated, includes alkyl moieties having at least one carbon-carbon triple bond wherein alkyl is as defined above. Heteroalkynyl is an alkynyl group that includes one or more N, O or S atoms.

The term "alcohol" refers to the —OH group. It can be a substituent of an alkyl group for example or other moiety.

The term "amine" refers to the —N(R)(R1) group (where R and R1 are each independently a hydrogen or non-hydrogen substituent) which can be a primary, second or tertiary amine and may be e.g. a substituent of an alkyl group. The term "thio" refers a group containing sulfur such as —SH and may be e.g. a substituent of an alkyl group.

The term "alkoxy", as used herein, unless otherwise indicated, includes O-alkyl groups wherein alkyl is as defined above.

The term "alkylamine", as used herein, unless otherwise indicated, includes a nitrogen group with one or more substituents at least one of which is an alkyl is as defined above.

The term "alkylthio", as used herein, unless otherwise indicated, includes S-alkyl groups wherein alkyl is as defined above. The term "alkylsulfinyl", as used herein, unless otherwise indicated, includes S(O)-alkyl groups wherein alkyl is as defined above. The term "alkylsulfonyl", as used herein, unless otherwise indicated, includes S(O)$_2$-alkyl groups wherein alkyl is as defined above.

As referred to herein, suitable heteroalkyl include optionally substituted C1-20alkoxy, optionally substituted alkylthio preferably having 1 to about 20 carbon atoms; optionally substituted alkylsulfinyl preferably 1 to about 20 carbon atoms; optionally substituted alkylsulfonyl preferably having 1 to about 20 carbon atoms; and optionally substituted alkylamine preferably having 1 to about 20 carbon atoms.\

As referred to herein, the term "carbon alicyclic group" means each ring member of the non-aromatic group is carbon. The carbon alicyclic group can have one or more endocyclic carbon-carbon double or triple bonds, provided the ring is not aromatic. The term optionally substituted "cycloalkyl group" means each ring member of the non-aromatic group is carbon and the carbon ring does not have any endocyclic carbon-carbon double bonds. For instance, cyclohexyl, cyclopentyl and adamantyl are cycloalkyl groups as well as carbon alicyclic groups. Carbon alicyclic groups and cycloalkyl groups may comprise one ring or multiple (e.g. 2, 3, 4 or more) bridged, fused or otherwise covalently linked rings. As understood, a cycloalkenyl or cycloakynyl group would include at least one endocyclic double or triple carbon-carbon bond, respectively.

The term "heterocycloalkyl" or other similar term is a non-aromatic group the same as specified above for cycloalkyl except at least one ring atom is N, O or S rather than carbon. The heterocycloakyl group can have one or more endocyclic carbon-carbon double bonds, provided the ring is not aromatic. Heterocycloalkyl groups may comprise one ring or multiple (e.g. 2, 3, 4 or more) bridged, fused or otherwise covalently linked rings. As understood, a heterocycloalkenyl or heterocycloalkynyl group would include at least one endocyclic double or triple carbon-carbon bond, respectively. Examples of non-aromatic heterocycloalkyl or heterocyclic groups are pyrrolidinyl, tetrahydrofuranyl, dihydrofuranyl, tetrahydrothienyl, tetrahydropyranyl, dihydropyranyl, tetrahydrothiopyranyl, piperidino, morpholino, thiomorpholino, thioxanyl, and indolinyl.

The term carbocyclic aryl refers to an aromatic group where the aromatic ring members are all carbon such as phenyl, naphthyl and anthracenyl.

As referred to herein, a "heteroaryl" or other similar term group includes an aromatic 5-8 membered monocyclic, 8-12 membered bicyclic, or 11-14 membered tricyclic ring system having 1-3 heteroatoms if monocyclic, 1-6 heteroatoms if bicyclic, or 1-9 heteroatoms if tricyclic, said heteroatoms selected from O, N, or S (e.g., carbon atoms and 1-3, 1-6, or 1-9 heteroatoms of N, O, or S if monocyclic, bicyclic, or tricyclic, respectively), wherein 0, 1, 2, 3, or 4 atoms of each ring may be substituted by a substituent. Examples of heteroaryl groups include pyridyl, furyl or furanyl, imidazolyl, benzimidazolyl, pyrimidinyl, thiophenyl or thienyl, quinolinyl, indolyl, thiazolyl, and the like.

Various materials and substituents (including substituents of the various Formulae (1) through (8) above) that are "optionally substituted" may be suitably substituted at one or more available positions by e.g. halogen (F, Cl, Br, I); nitro; hydroxy; amino; alkyl such as $C_{1-8}$ alkyl; alkenyl such as $C_{2-8}$ alkenyl; alkylamino such as $C_{1-8}$ alkylamino; carbocyclic aryl such as phenyl, naphthyl, anthracenyl, etc; and the like.

In generally preferred aspects, the first resin and second resin components of a coating composition prior to thermal treatment are distinct and separate materials, i.e. the resin component and crosslinker component are not covalently linked. In certain other embodiments, the crosslinker component can be linked to the resin component, for example covalently tethered as a pendant group.

As discussed, a variety of resins may serve as the resin components of an underlying coating composition.

Particularly preferred resins of coating compositions of the invention may comprise polyester linkages. Polyester resins can be readily prepared by reaction of one or more polyol reagents with one or more carboxy-containing (such as a carboxylic acid, ester, anhydride, etc.) compounds. Suitable polyol reagents include diols, glycerols and triols such as e.g. diols such as diol is ethylene glycol, 1,2-propylene glycol, 1,3-propylene glycol, butane diol, pentane diol, cyclobutyl diol, cyclopentyl diol, cyclohexyl diol, dimethylolcyclohexane, and triols such as glycerol, trimethylolethane, trimethylolpropane and the like.

Preferred polyester resins for use in an antireflective composition of the invention are also disclosed in U.S. Pat. No. 8,501,383; U.S. 2011/0033801; and U.S. Pat. No. 7,163,751. As disclosed in those patent documents, resins that contain ester repeat units (polyester) may be suitably provided by polymerization of a carboxy-containing compound (such as a carboxylic acid, ester, anhydride, etc.) and a hydroxy-containing compound, preferably a compound having multiple hydroxy groups such as a glycol, e.g. ethylene glycol or propylene glycol, or glycerol, or other diols, triols, tetraols and the like. In certain aspects, preferably, an ester functionality is present as a component of, or within, the polymer backbone rather than as a pendant or side chain unit. Ester moieties also may be present as a pendant group, but preferably the polymer also contains an ester functionality along the polymer backbone. Also preferred is where the ester repeat unit comprises aromatic substitution, such as optionally substituted carbocyclic aryl groups e.g. optionally substituted phenyl, naphthyl or anthracenyl substitution, either as a side chain or more preferably along the polymer backbone.

Resins of coating compositions of the invention may comprise a variety of additional groups such as cyanurate groups, as disclosed in U.S. Pat. Nos. 6,852,421 and 8,501,383.

As discussed, particularly preferred first and/or second (epoxy crosslinker) resins of coating compositions of the invention may comprise one or more one or more cyanurate groups and polyester linkages.

As discussed, for antireflective applications, suitably one or more of the compounds reacted to form the resin comprise a moiety that can function as a chromophore to absorb radiation employed to expose an overcoated photoresist coating layer. For example, a phthalate compound (e.g. a phthalic acid or dialkyl phthalate (i.e. di-ester such as each ester having 1-6 carbon atoms, preferably a di-methyl or ethyl phthalate) may be polymerized with an aromatic or non-aromatic polyol and optionally other reactive compounds to provide a polyester particularly useful in a coating composition employed with a photoresist imaged at sub-200 nm wavelengths such as 193 nm. An isocyanurate compound also may be polymerzied with one or more polyols to provide a resin useful in the present underlying coating compositions. Resins to be used in compositions with an overcoated photoresist imaged at sub-300 nm wavelengths or sub-200 nm wavelengths such as 248 nm or 193 nm, a naphthyl compound may be polymerized, such as a naphthyl compound containing one or two or more carboxyl substituents e.g. dialkyl particularly di-$C_{1-6}$alkyl naphthalenedicarboxylate. Reactive anthracene compounds also are preferred, e.g. an anthracene compound having one or more carboxy or ester groups, such as one or more methyl ester or ethyl ester groups.

The compound that contains a chromophore unit also may contain one or preferably two or more hydroxy groups and be reacted with a carboxyl-containing compound. For example, a phenyl compound or anthracene compound having one, two or more hydroxyl groups may be reacted with a carboxyl-containing compound.

Additionally, underlying coating compositions that are employed for antireflective purposes may contain a material that contains chromophore units that is separate from a resin component that provides water contact angle modulation (e.g. a resin that contains photoacid-labile groups and/or base-reactive groups. For instance, the coating composition may comprise a polymeric or non-polymeric compound that contains phenyl, anthracene, naphthyl, etc. units. It is often preferred, however, that the one or more resins that provide water contact angle modulation also contain chromophore moieties.

Preferred second resins that comprise an epoxy group include acrylate polymers such as polymers that comprise one or more of the following units. In the following structures, the values x, y and z designate mole percentage of the specified repeat unit as percent in a resin. Suitable values of each n in the below structures include 0 and a positive integer, typically 0, 1, 2, 3, 4, 5 or 6, more typically 1, 2, 3, 4, 5 or 6:

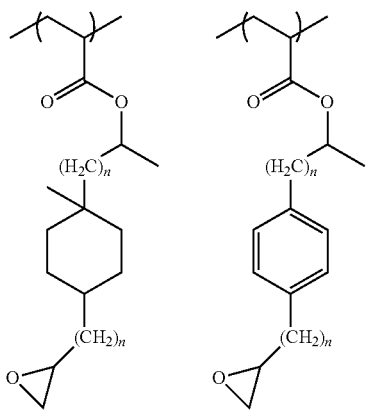
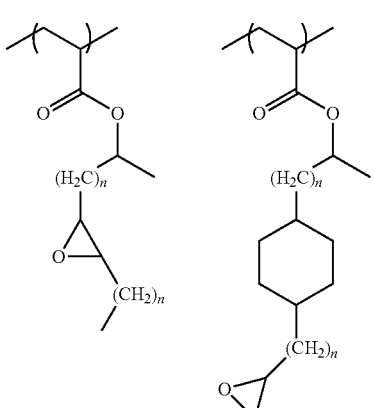
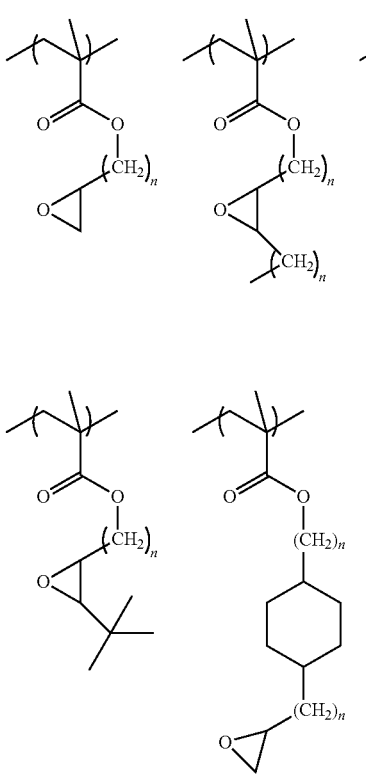
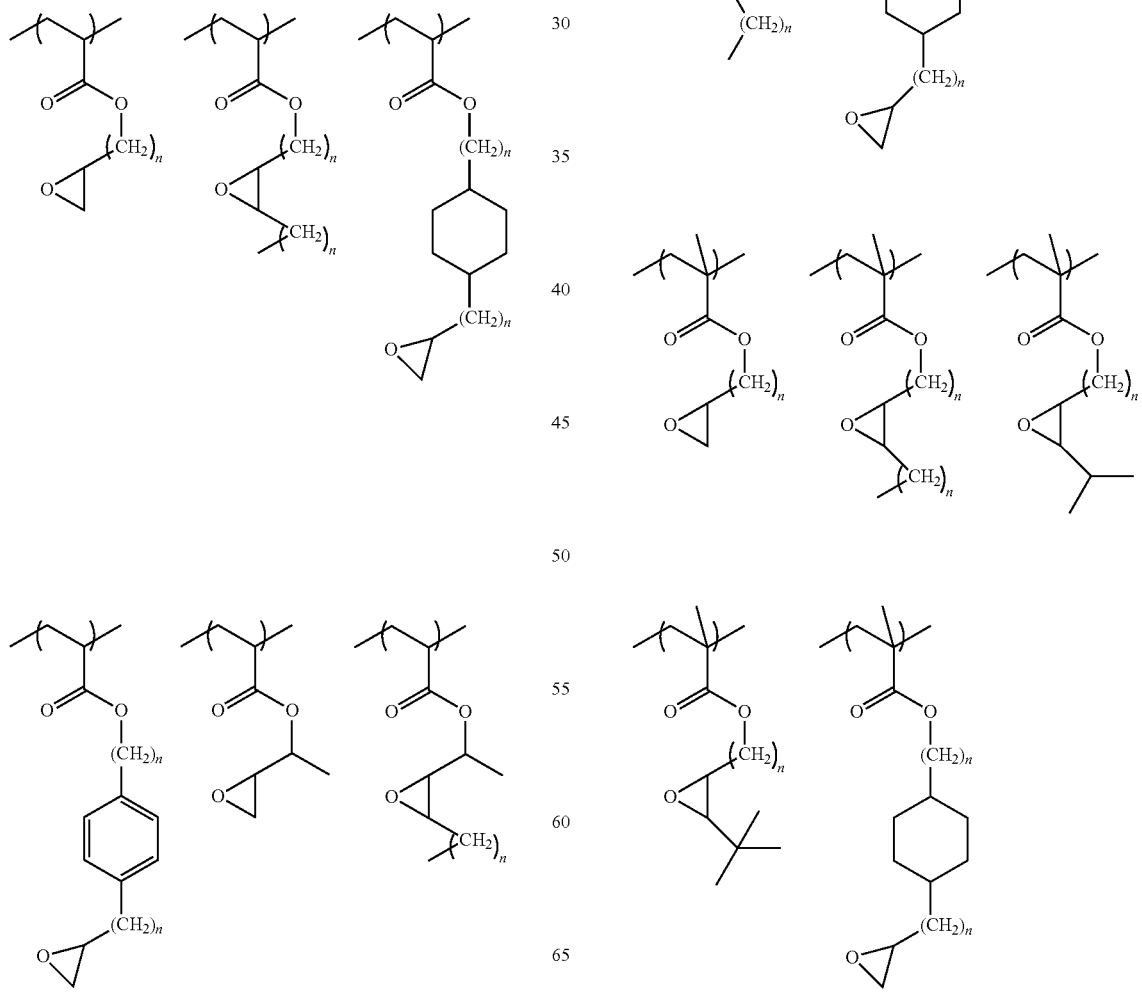

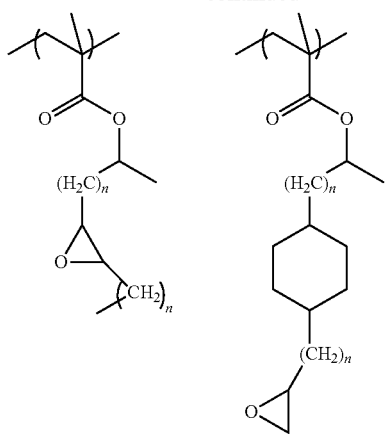
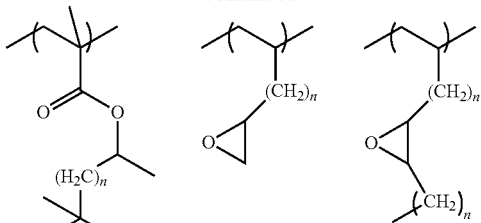
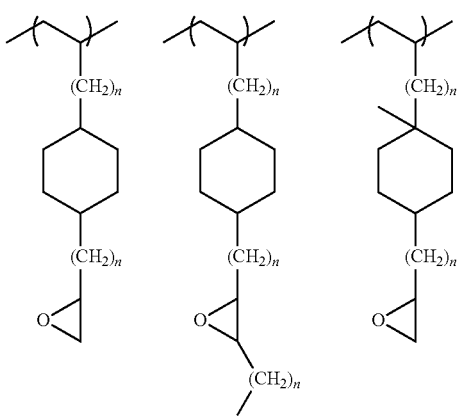
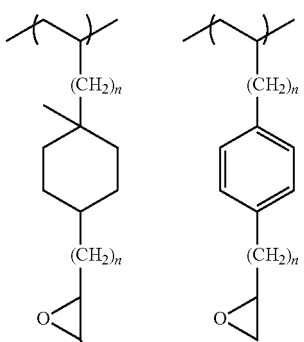
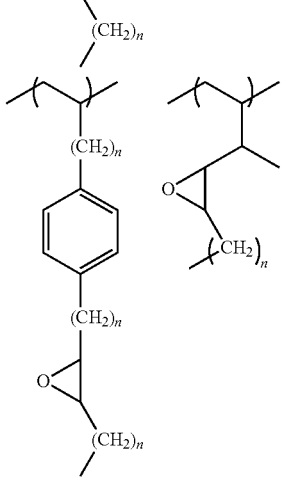

-continued

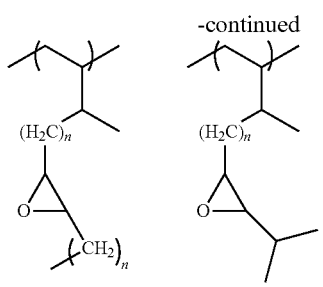
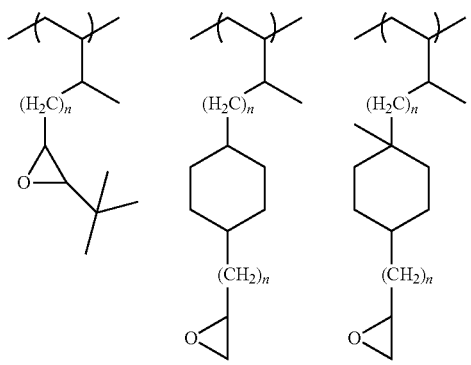
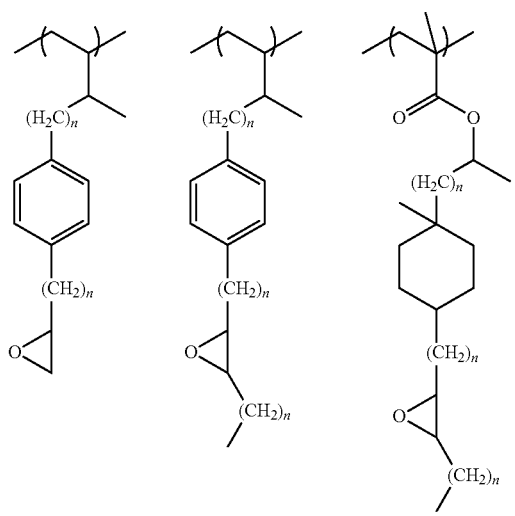
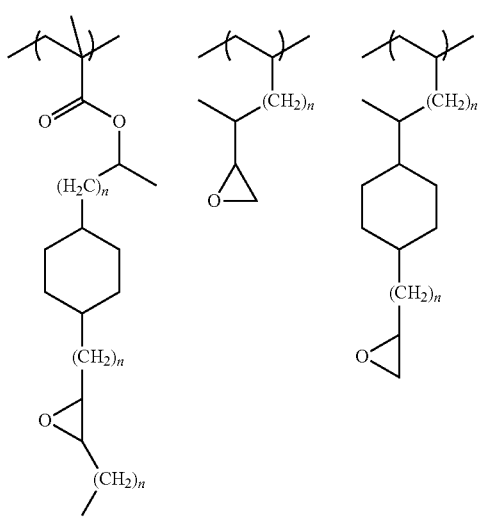

-continued

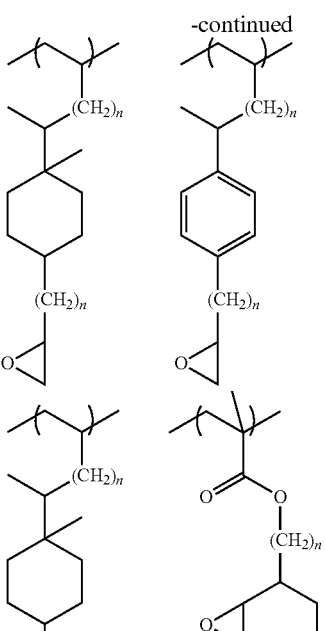
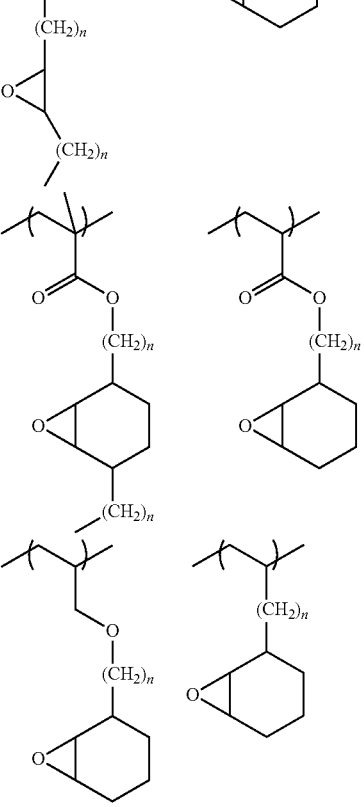

Preferably resins of underlying coating compositions of the invention will have a weight average molecular weight (Mw) of about 1,000 to about 1,000,000 daltons, more typically about 2,000 to about 50,000 daltons, and a number average molecular weight (Mn) of about 500 to about 1,000,000 daltons. Molecular weights (either Mw or Mn) of the resins of compositions of the invention are suitably determined by gel permeation chromatography.

Underlying coating compositions may comprise the first and second resins in varying amounts. Typical, each type of resin (i.e. each of the first and/or second (crosslinker resins))

is present in a coating composition in an amount of at least 5 weight percent based on weight of total solids (all materials except solvent carrier) of the composition, more typically each type of resin is present in a coating composition in an amount of at least 10, 15 or 20 weight percent based on weight of total solids of the composition.

The resins component will be the major solids component of an underlying coating composition in many preferred embodiments. For instance, the resin suitably may be present from 50 to 99.9 weight percent based on total solid content of a coating composition, more typically from 80 to 95 weight percent based total solid content of a coating composition. As referred to herein, solids of a coating composition refer to all materials of the coating composition except solvent carrier.

In certain embodiments, a coating composition of the invention may comprise a crosslinker in addition to an expoy resin (second resin). For example, coating compositions may include amine-based crosslinkers such as melamine materials, including melamine resins such as manufactured by Cytec Industries and sold under the tradename of Cymel 300, 301, 303, 350, 370, 380, 1116 and 1130; glycolurils including those glycolurils available from Cytec Industries; and benzoquanamines and urea-based materials including resins such as the benzoquanamine resins available from Cytec Industries under the name Cymel 1123 and 1125, and urea resins available from Cytec Industries under the names of Powderlink 1174 and 1196. In addition to being commercially available, such amine-based resins may be prepared e.g. by the reaction of acrylamide or methacrylamide copolymers with formaldehyde in an alcohol-containing solution, or alternatively by the copolymerization of N-alkoxymethyl acrylamide or methacrylamide with other suitable monomers.

Particularly preferred coating compositions of the invention also may contain acid free acids and/or acid generators that can function to promote hardening or crosslinking of composition components. Thermal-induced crosslinking of the coating composition by activation of an acid generator is generally preferred.

Examples of free acids include, but are not limited to, sulfonic acids such as methane sulfonic acid, ethane sulfonic acid, propyl sulfonic acid, phenyl sulfonic acid, toluene sulfonic acid, dodecylbenzene sulfonic acid, and trifluoromethyl sulfonic acid.

Suitable acid generators include thermal acid generators (TAGs), photoacid generators (PAGs) and combinations thereof.

Suitable thermal acid generator compounds for use in a coating composition include ionic or substantially neutral thermal acid generators. Suitable nonionic thermal acid generators include, for example, cyclohexyl trifluoromethylsulfonate, methyl trifluoromethylsulfonate, cyclohexyl p-toluenesulfonate, methyl p-toluenesulfonate, cyclohexyl 2,4,6-triisopropylbenzene sulfonate, nitrobenzyl esters, benzoin tosylate, 2-nitrobenzyl tosylate, tris(2,3-dibromopropyl)-1,3,5-triazine-2,4,6-trione, alkyl esters of organic sulfonic acids, p-toluenesulfonic acid, dodecylbenzenesulfonic acid, oxalic acid, phthalic acid, phosphoric acid, camphorsulfonic acid, 2,4,6-trimethylbenzene sulfonic acid, triisopropylnaphthalene sulfonic acid, 5-nitro-o-toluene sulfonic acid, 5-sulfosalicylic acid, 2,5-dimethylbenzene sulfonic acid, 2-nitrobenzene sulfonic acid, 3-chlorobenzene sulfonic acid, 3-bromobenzene sulfonic acid, 2-fluorocaprylnaphthalene sulfonic acid, dodecylbenzene sulfonic acid, 1-naphthol-5-sulfonic acid, 2-methoxy-4-hydroxy-5-benzoyl-benzene sulfonic acid, and their salts, and combinations thereof.

Suitable ionic thermal acid generators include, for example, dodecylbenzenesulfonic acid triethylamine salts, dodecylbenzenedisulfonic acid triethylamine salts, p-toluene sulfonic acid-ammonium salts, sulfonate salts, such as carbocyclic aryl (e.g. phenyl, napthyl, anthracenyl, etc.) and heteroaryl (e.g. thienyl) sulfonate salts, aliphatic sulfonate salts, benzenesulfonate salts and ammonium triflate salts including benzylpyridium and benzylanilinium salts of triflic acid. Compounds that generate a sulfonic acid or a triflic acid upon activation are generally suitable. Preferred thermal acid generators include p-toluenesulfonic acid ammonium salts, ammonium triflate salts. Certain photoacid generators can also function as thermal acid generators, generating an acid upon exposure to activating radiation or heat. The following compounds, for example, can function as a PAG or TAG:

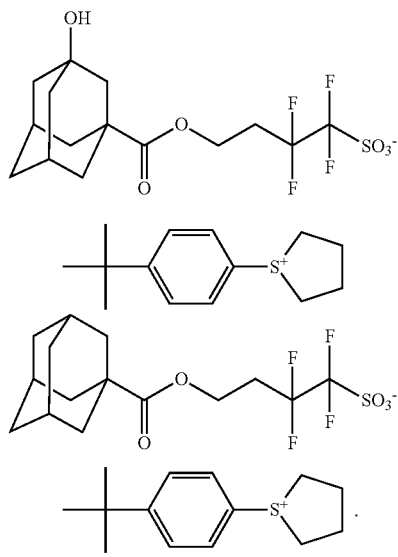

When used as a TAG, these compounds provide relatively slow crosslinking (high crosslinking onset temperature) as compared with ammonium salts so that high $\Delta T_{o-g}$ can be realized.

Typically one or more acid generators are present in a coating composition in a concentration from about 0.1 to 10 percent by weight of the total of the dry components of the composition (all components except solvent carrier), more preferably about 0.5 to 2 percent by weight of the total dry components.

Coating compositions of the invention, particularly for reflection control applications, also may contain additional dye compounds that absorb radiation used to expose an overcoated photoresist layer. Other optional additives include surface leveling agents, for example, the leveling agent available under the tradename Silwet 7604, or the surfactant FC 171 or FC 431 available from the 3M Company.

Underlying coating compositions of the invention also may contain other materials such as a photoacid generator, including a photoacid generator as discussed for use with an overcoated photoresist composition. See U.S. Pat. No. 6,261,743 for a discussion of such use of a photoacid generator in an antireflective composition.

To make a liquid coating composition of the invention, the components of the coating composition are dissolved in a suitable solvent such as, for example, one or more oxyisobutyric acid esters particularly methyl-2-hydroxyisobutyrate, ethyl lactate or one or more of the glycol ethers such as 2-methoxyethyl ether (diglyme), ethylene glycol monomethyl ether, and propylene glycol monomethyl ether; solvents that have both ether and hydroxy moieties such as methoxy butanol, ethoxy butanol, methoxy propanol, and ethoxy propanol; methyl 2-hydroxyisobutyrate; esters such as methyl cellosolve acetate, ethyl cellosolve acetate, propylene glycol monomethyl ether acetate, dipropylene glycol monomethyl ether acetate and other solvents such as dibasic esters, propylene carbonate and gamma-butyro lactone. The concentration of the dry components in the solvent will depend on several factors such as the method of application. In general, the solid content of an underlying coating composition varies from about 0.5 to 20 weight percent of the total weight of the coating composition, preferably the solid content varies from about 0.5 to 10 weight of the coating composition.

Exemplary Photoresist Systems

Photoresists for use with an underlying coating composition typically comprise a polymer and one or more acid generators. Generally preferred are positive-tone resists and the resist polymer has functional groups that impart alkaline aqueous solubility to the resist composition. For example, preferred are polymers that comprise polar functional groups such as hydroxyl or carboxylate, or acid-labile groups that can liberate such polar moieties upon lithographic processing. Preferably the polymer is used in a resist composition in an amount sufficient to render the resist developable with an aqueous alkaline solution.

Acid generators are also suitably used with polymers that comprise repeat units containing aromatic groups, such as optionally substituted phenyl including phenol, optionally substituted naphthyl, and optionally substituted anthracene. Optionally substituted phenyl (including phenol) containing polymers are particularly suitable for many resist systems, including those imaged with EUV and e-beam radiation. For positive-acting resists, the polymer also preferably contains one or more repeat units that comprise acid-labile groups. For example, in the case of polymers containing optionally substituted phenyl or other aromatic groups, a polymer may comprise repeat units that contain one or more acid-labile moieties such as a polymer that is formed by polymerization of monomers of an acrylate or methacrylate compound with acid-labile ester (e.g. t-butyl acrylate or t-butyl methacrylate). Such monomers may be copolymerized with one or more other monomers that comprise aromatic group(s) such as optionally phenyl, e.g. a styrene or vinyl phenol monomer.

Preferred monomers used for the formation of such polymers include: an acid-labile monomer having the following formula (V), a lactone-containing monomer of the following formula (VI), a base-soluble monomer of the following formula (VII) for adjusting dissolution rate in alkaline developer, and an acid-generating monomer of the following formula (VIII), or a combination comprising at least one of the foregoing monomers:

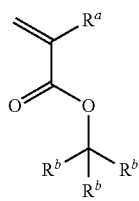

(V)

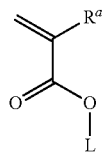

(VI)

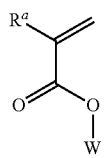

(VII)

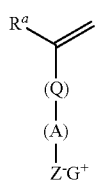

(VIII)

wherein each $R^a$ is independently H, F, —CN, $C_{1-10}$ alkyl, or $C_{1-10}$ fluoroalkyl. In the acid-deprotectable monomer of formula (V), $R^b$ is independently $C_{1-20}$ alkyl, $C_{3-20}$ cycloalkyl, $C_{6-20}$ aryl, or $C_{7-20}$ aralkyl, and each $R^b$ is separate or at least one $R^b$ is bonded to an adjacent $R^b$ to form a cyclic structure. In lactone-containing monomer of formula (VI), L is a monocyclic, polycyclic, or fused polycyclic $C_{4-20}$ lactone-containing group. In the base solubilizing monomer of formula (VII), W is a halogenated or non-halogenated, aromatic or non-aromatic $C_{2-50}$ hydroxyl-containing organic group having a pKa of less than or equal to 12. In the acid generating monomer of formula (VIII), Q is ester-containing or non-ester containing and fluorinated or non-fluorinated and is $C_{1-20}$ alkyl, $C_{3-20}$ cycloalkyl, $C_{6-20}$ aryl, or $C_{7-20}$ aralkyl group, A is ester-containing or non-ester-containing and fluorinated or non-fluorinated, and is $C_{1-20}$ alkyl, $C_{3-20}$ cycloalkyl, $C_{6-20}$ aryl, or $C_{7-20}$ aralkyl, Z is an anionic moiety comprising carboxylate, sulfonate, an anion of a sulfonamide, or an anion of a sulfonimide, and $G^+$ is a sulfonium or iodonium cation.

Exemplary acid-deprotectable monomers include but are not limited to:

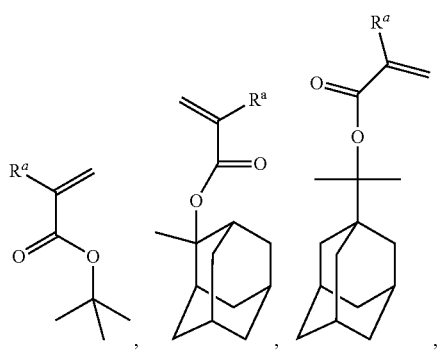

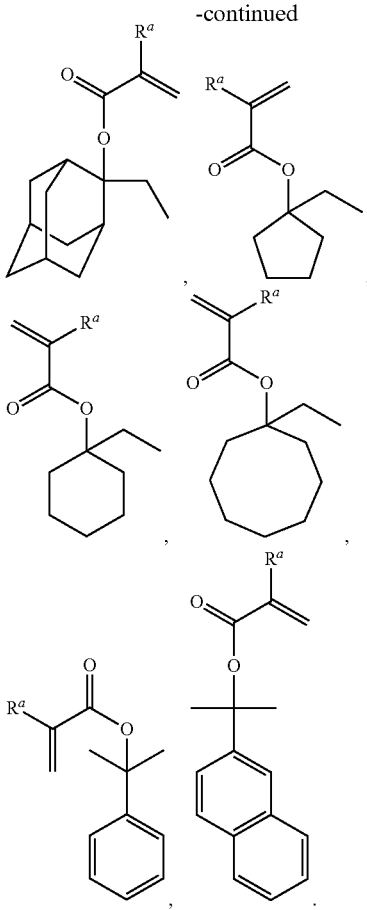

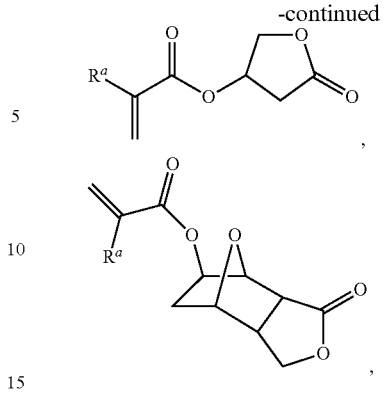

or a combination comprising at least one of the foregoing monomers, wherein $R^a$ is H, F, —CN, $C_{1-10}$ alkyl, or $C_{1-10}$ fluoroalkyl.

Suitable base-soluble monomers may be of the following formula (X):

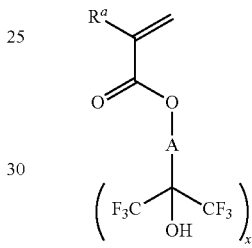

(X)

wherein each $R^a$ is independently H, F, —CN, $C_{1-10}$ alkyl, or $C_{1-10}$ fluoroalkyl, A is a hydroxyl-containing or non-hydroxyl containing, ester-containing or non ester-containing, fluorinated or non-fluorinated $C_{1-20}$ alkylene, $C_{3-20}$ cycloalkylene, $C_{6-20}$ arylene, or $C_{7-20}$ aralkylene, and x is an integer of from 0 to 4, wherein when x is 0, A is a hydroxyl-containing $C_{6-20}$ arylene.

Exemplary base soluble monomers include those having the following structures:

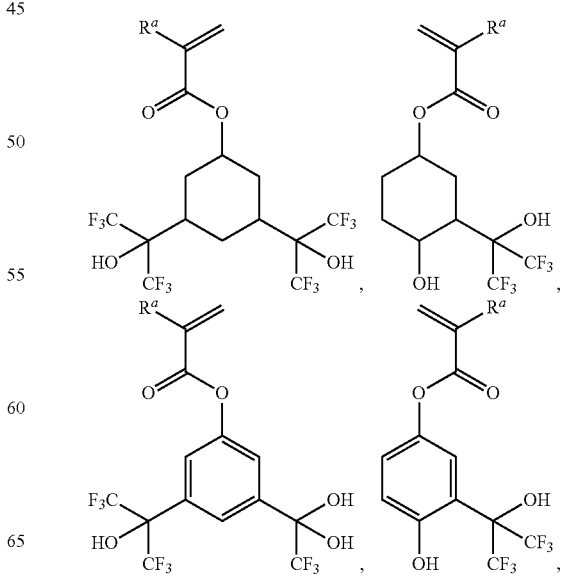

or a combination comprising at least one of the foregoing, wherein $R^a$ is H, F, —CN, $C_{1-6}$ alkyl, or $C_{1-6}$ fluoroalkyl.

Suitable lactone monomers may be of the following formula (IX):

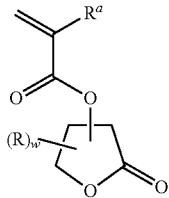

(IX)

wherein $R^a$ is H, F, —CN, $C_{1-6}$ alkyl, or $C_{1-6}$ fluoroalkyl, R is a $C_{1-10}$ alkyl, cycloalkyl, or heterocycloalkyl, and w is an integer of 0 to 5. In formula (IX), R is attached directly to the lactone ring or commonly attached to the lactone ring and/or one or more R groups, and the ester moiety is attached to the lactone ring directly, or indirectly through R.

Exemplary lactone-containing monomers include:

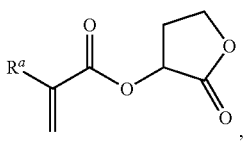

-continued

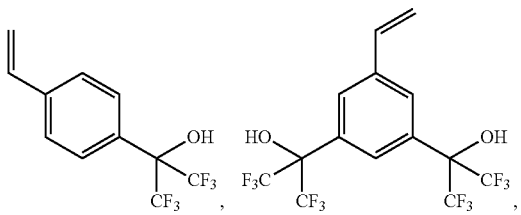

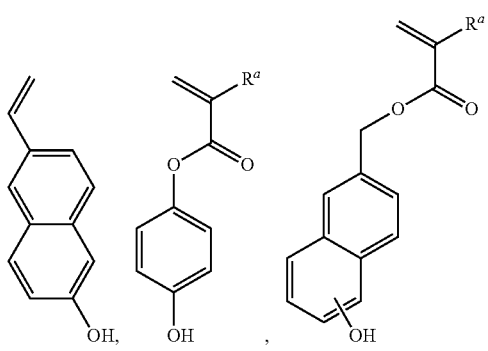

or a combination comprising at least one of the foregoing, wherein $R^a$ is H, F, —CN, $C_{1-6}$ alkyl, or $C_{1-6}$ fluoroalkyl.

Preferred acid generating monomers include those of the formulae (XI) or (XII):

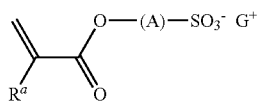
(XI)

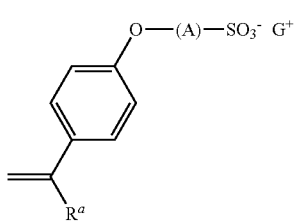
(XII)

wherein each $R^a$ is independently H, F, —CN, $C_{1-6}$ alkyl, or $C_{1-6}$ fluoroalkyl, A is a fluorine-substituted $C_{1-30}$ alkylene group, a fluorine-substituted $C_{3-30}$ cycloalkylene group, a fluorine-substituted $C_{6-30}$ arylene group, or a fluorine-substituted $C_{7-30}$ alkylene-arylene group, and $G^+$ is a sulfonium or iodonium cation.

Preferably, in formulas (XI) and (XII), A is a —[(C($R^1$)$_2$)$_x$C(=O)O]$_b$—C(($R^2$)$_2$)$_y$(CF$_2$)$_z$— group, or an o-, m- or p- substituted —$C_6F_4$— group, where each $R^1$ and $R^2$ are each independently H, F, —CN, $C_{1-6}$ fluoroalkyl, or $C_{1-6}$ alkyl, b is 0 or 1, x is an integer of 1 to 10, y and z are independently integers of from 0 to 10, and the sum of y+z is at least 1.

Exemplary preferred acid generating monomers include:

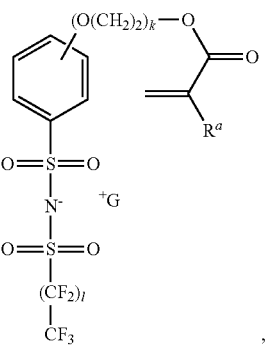

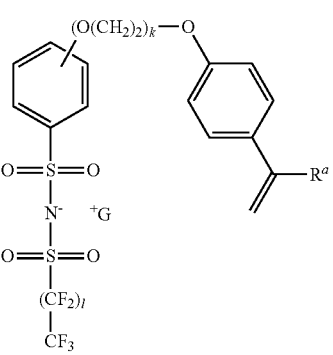

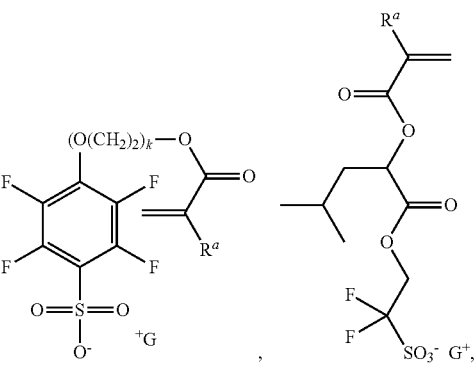

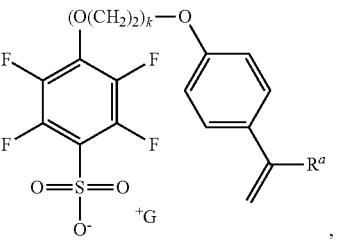

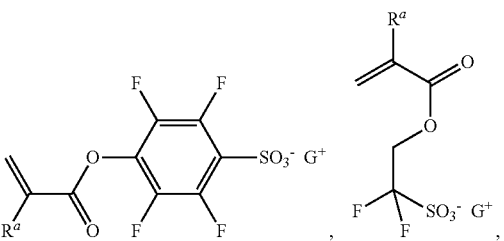

-continued

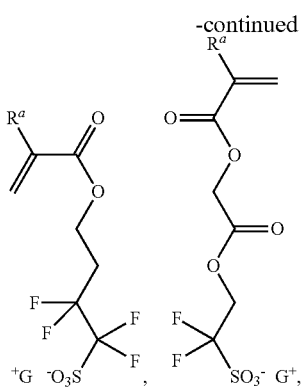

or a combination comprising at least one of the foregoing, where each $R^a$ is independently H, F, —CN, $C_{1-6}$ alkyl, or $C_{1-6}$ fluoroalkyl, k is suitably an integer of from 0 to 5; and $G^+$ is a sulfonium or iodonium cation. $G^+$ as referred to herein throughout the various formulae may be an acid generator as disclosed herein and comprise an oxo-dioxolane moiety and/or an oxo-dioxane moiety.

Preferred acid-generating monomers may include sulfonium or iodonium cation. Preferably, in formula (IV), $G^+$ is of the formula (XIII):

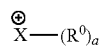 (XIII)

wherein X is S or I, each $R^0$ is halogenated or non-halogenated and is independently $C_{1-30}$ alkyl group; a polycyclic or monocyclic $C_{3-30}$ cycloalkyl group; a polycyclic or monocyclic $C_{4-30}$ aryl group; or a combination comprising at least one of the foregoing, wherein when X is S, one of the $R^0$ groups is optionally attached to one adjacent $R^0$ group by a single bond, and a is 2 or 3, wherein when X is I, a is 2, or when X is S, a is 3.

Exemplary acid generating monomers include those having the formulas:

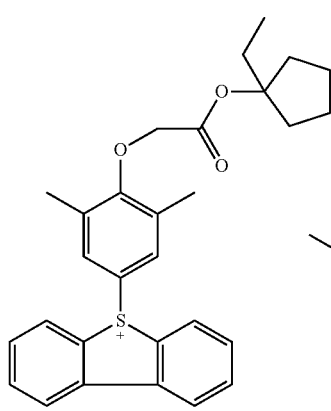

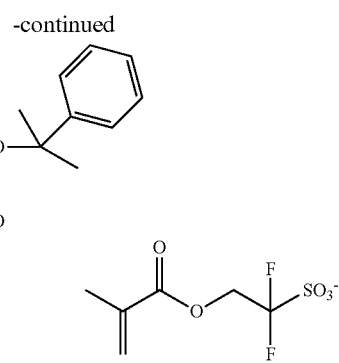

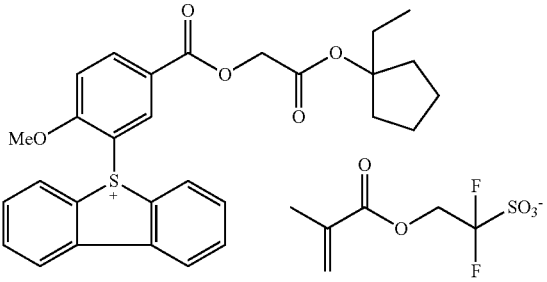

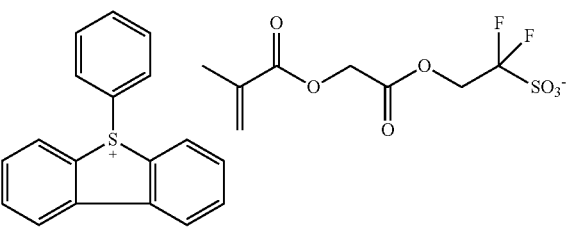

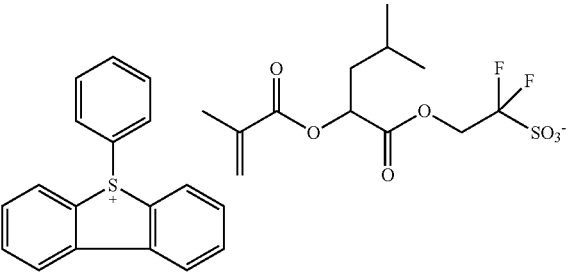

-continued

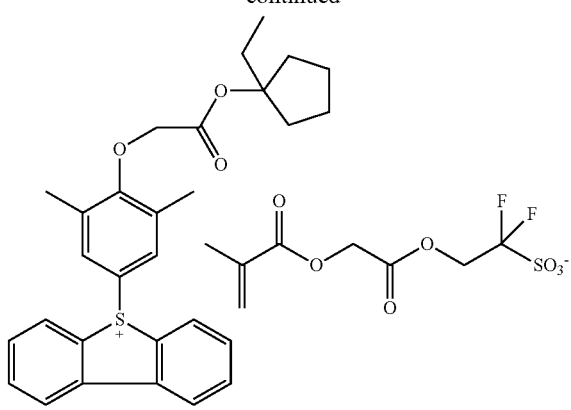

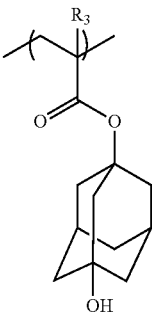

Specifically suitable polymers that have acid-labile deblocking groups for use in a positive-acting chemically-amplified photoresist of the invention have been disclosed in European Patent Application 0829766A2 (polymers with acetal and ketal polymers) and European Patent Application EP0783136A2 (terpolymers and other copolymers including units of 1) styrene; 2) hydroxystyrene; and 3) acid labile groups, particularly alkyl acrylate acid labile groups.

Additional preferred resins for use in photoresists to be imaged at sub-200 nm, such as at 193 nm, comprises units of the following general formulae (I), (II) and (III):

Preferred resins for use in photoresists to be imaged at sub-200 nm, such as at 193 nm, comprise units of the following general formulae (I), (II) and (III):

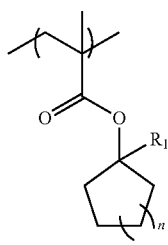
(I)

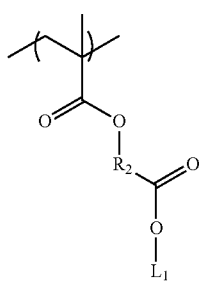
(II)

-continued (III)

wherein: $R_1$ is a $(C_1$-$C_3)$alkyl group; $R_2$ is a $(C_1$-$C_3)$alkylene group; $L_1$ is a lactone group; and n is 1 or 2.

Polymers for use in photoresists of the invention may suitably vary widely in molecular weight and polydisperity. Suitable polymers include those that have an $M_w$ of from about 1,000 to about 50,000, more typically about 2,000 to about 30,000 with a molecular weight distribution of about 3 or less, more typically a molecular weight distribution of about 2 or less.

Preferred negative-acting compositions of the invention comprise a mixture of materials that will cure, crosslink or harden upon exposure to acid, and two or more acid generators as disclosed herein. Preferred negative acting compositions comprise a polymer binder such as a phenolic or non-aromatic polymer, a crosslinker component and a photoactive component of the invention. Such compositions and the use thereof have been disclosed in European Patent Applications 0164248 and U.S. Pat. No. 5,128,232 to Thackeray et al. Preferred phenolic polymers for use as the polymer binder component include novolaks and poly(vinylphenol)s such as those discussed above. Preferred crosslinkers include amine-based materials, including melamine, glycolurils, benzoguanamine-based materials and urea-based materials. Melamine-formaldehyde polymers are often particularly suitable. Such crosslinkers are commercially available, e.g. the melamine polymers, glycoluril polymers, urea-based polymer and benzoguanamine polymers, such as those sold by Cytec under tradenames Cymel 301, 303, 1170, 1171, 1172, 1123 and 1125 and Beetle 60, 65 and 80.

Particularly preferred photoresists of the invention may be used in immersion lithography applications. See, for example, U.S. Pat. No. 7,968,268 to Rohm and Haas Electronic Materials for a discussion of preferred immersion lithography photoresists and methods.

Photoresists of the invention also may comprise a single acid generator or a mixture of distinct acid generators, typically a mixture of 2 or 3 different acid generators, more typically a mixture that consists of a total of 2 distinct acid generators. The photoresist composition comprises an acid generator employed in an amount sufficient to generate a latent image in a coating layer of the composition upon exposure to activating radiation. For example, the acid generator will suitably be present in an amount of from 1 to 20 wt % based on total solids of the photoresist composition.

Suitable acid generators are known in the art of chemically amplified photoresists and include, for example: onium salts, for example, triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate; nitrobenzyl derivatives, for example, 2-nitrobenzyl-p-toluenesulfonate, 2,6-dinitrobenzyl-p-toluenesulfonate, and 2,4-dinitrobenzyl-p-toluenesulfonate; sulfonic acid esters, for example, 1,2,3-tris(methanesulfonyloxy) benzene, 1,2,3-tris(trifluoromethanesulfonyloxy)benzene, and 1,2,3-tris(p-toluenesulfonyloxy)benzene; diazomethane derivatives, for example, bis(benzenesulfonyl)diazomethane, bis(p-toluenesulfonyl)diazomethane; glyoxime derivatives, for example, bis-O-(p-toluenesulfonyl)-α-dimethylglyoxime, and bis-O-(n-butanesulfonyl)-α-dimethylglyoxime; sulfonic acid ester derivatives of an N-hydroxyimide compound, for example, N-hydroxysuccinimide methanesulfonic acid ester, N-hydroxysuccinimide trifluoromethanesulfonic acid ester; and halogen-containing triazine compounds, for example, 2-(4-methoxyphenyl)-4,6-bis(trichloromethyl)-1,3,5-triazine, and 2-(4-methoxynaphthyl)-4,6-bis(trichloromethyl)-1,3,5-triazine.

As referred to herein, acid generators can produce an acid when exposed to activating radiation, such as EUV radiation, e-beam radiation, 193 nm wavelength radiation or other radiation sources. Acid generator compounds as referred to herein also may be referred to as photoacid generator compounds.

Photoresists of the invention also may contain other materials. For example, other optional additives include actinic and contrast dyes, anti-striation agents, plasticizers, speed enhancers and sensitizers. Such optional additives typically will be present in minor concentration in a photoresist composition.

Alternatively, or in addition, other additives may include quenchers that are non-photo-destroyable bases, such as, for example, those based on hydroxides, carboxylates, amines, imines, and amides. Preferably, such quenchers include $C_{1-30}$ organic amines, imines, or amides, or may be a $C_{1-30}$ quaternary ammonium salt of a strong base (e.g., a hydroxide or alkoxide) or a weak base (e.g., a carboxylate). Exemplary quenchers include amines such as tripropylamine, dodecylamine, tris(2-hydroxypropyl)amine, oltetrakis (2-hydroxypropyl)ethylenediamine; aryl amines such as diphenylamine, triphenylamine, aminophenol, and 2-(4-aminophenyl)-2-(4-hydroxyphenyl)propane, a hindered amine such as diazabicycloundecene (DBU) or diazabicyclononene (DBN), or ionic quenchers including quaternary alkyl ammonium salts such as tetrabutylammonium hydroxide (TBAH) or tetrabutylammonium lactate.

Surfactants include fluorinated and non-fluorinated surfactants, and are preferably non-ionic. Exemplary fluorinated non-ionic surfactants include perfluoro $C_4$ surfactants such as FC-4430 and FC-4432 surfactants, available from 3M Corporation; and fluorodiols such as POLYFOX PF-636, PF-6320, PF-656, and PF-6520 fluorosurfactants from Omnova.

The photoresist further includes a solvent generally suitable for dissolving, dispensing, and coating the components used in a photoresists. Exemplary solvents include anisole, alcohols including ethyl lactate, 1-methoxy-2-propanol, and 1-ethoxy-2 propanol, esters including n-butylacetate, 1-methoxy-2-propyl acetate, methoxyethoxypropionate, ethoxyethoxypropionate, ketones including cyclohexanone and 2-heptanone, and a combination comprising at least one of the foregoing solvents.

Lithographic Processing

In use, a coating composition of the invention is applied as a coating layer to a substrate by any of a variety of methods such as spin coating. The coating composition in general is applied on a substrate with a dried layer thickness of between about 0.02 and 0.5 μm, preferably a dried layer thickness of between about 0.04 and 0.20 μm. The substrate is suitably any substrate used in processes involving photoresists. For example, the substrate can be silicon, silicon dioxide or aluminum-aluminum oxide microelectronic wafers. Gallium arsenide, silicon carbide, ceramic, quartz or copper substrates may also be employed. Substrates for liquid crystal display or other flat panel display applications are also suitably employed, for example glass substrates, indium tin oxide coated substrates and the like. Substrates for optical and optical-electronic devices (e.g. waveguides) also can be employed.

Preferably the applied coating layer is cured before a photoresist composition is applied over the underlying coating composition. Cure conditions will vary with the components of the underlying coating composition. Particularly the cure temperature will depend on the specific acid or acid (thermal) generator that is employed in the coating composition. Typical cure conditions are from about 80° C. to 225° C. for about 0.5 to 5 minutes. Cure conditions preferably render the coating composition coating layer substantially insoluble to the photoresist solvent as well the developer solution to be used.

After such curing, a photoresist is applied above the surface of the applied coating composition. As with application of the bottom coating composition layer(s), the overcoated photoresist can be applied by any standard means such as by spinning, dipping, meniscus or roller coating. Following application, the photoresist coating layer is typically dried by heating to remove solvent preferably until the resist layer is tack free. Optimally, essentially no intermixing of the bottom composition layer and overcoated photoresist layer should occur.

The resist layer is then imaged with activating radiation such as 248 nm, 193 nm or EUV radiation through a mask in a conventional manner. The exposure energy is sufficient to effectively activate the photoactive component of the resist system to produce a patterned image in the resist coating layer. Typically, the exposure energy ranges from about 3 to 300 mJ/cm$^2$ and depending in part upon the exposure tool and the particular resist and resist processing that is employed. The exposed resist layer may be subjected to a post-exposure bake if desired to create or enhance solubility differences between exposed and unexposed regions of a coating layer. For example, negative acid-hardening photoresists typically require post-exposure heating to induce the acid-promoted crosslinking reaction, and many chemically amplified positive-acting resists require post-exposure heating to induce an acid-promoted deprotection reaction. Typically post-exposure bake conditions include temperatures of about 50° C. or greater, more specifically a temperature in the range of from about 50° C. to about 160° C.

The photoresist layer also may be exposed in an immersion lithography system, i.e. where the space between the exposure tool (particularly the projection lens) and the photoresist coated substrate is occupied by an immersion fluid, such as water or water mixed with one or more additives such as cesium sulfate which can provide a fluid of enhanced refractive index. Preferably the immersion fluid (e.g., water) has been treated to avoid bubbles, e.g. water can be degassed to avoid nanobubbles.

References herein to "immersion exposing" or other similar term indicates that exposure is conducted with such a fluid layer (e.g. water or water with additives) interposed between an exposure tool and the coated photoresist composition layer.

The exposed photoresist layer is then treated with a suitable developer capable of selectively removing portions of the film to form a photoresist pattern. In a negative tone development process, unexposed regions of a photoresist layer can be selectively removed by treatment with a suitable nonpolar solvent. See U.S. 2011/0294069 for suitable procedures for negative tone development. Typical nonpolar solvents for negative tone development are organic developers, such as a solvent chosen from ketones, esters, hydrocarbons, and mixtures thereof, e.g. acetone, 2-hexanone, 2-heptanone, methyl acetate, butyl acetate, and tetrahydrofuran. Photoresist materials used in the NTD process preferably form a photoresist layer that can form a negative image with organic solvent developer or a positive image with aqueous base developer such as tetraalkylammonium hydroxide solution. Preferably, the NTD photoresist is based on a polymer having acid sensitive (deprotectable) groups which, when deprotected, form carboxylic acid groups and/or hydroxyl groups.

Alternatively, development of the exposed photoresist layer can be accomplished by treating the exposed layer to a suitable developer capable of selectively removing the exposed portions of the film (where the photoresist is positive tone) or removing the unexposed portions of the film (where the photoresist is crosslinkable in the exposed regions, i.e., negative tone). Preferably, the photoresist is positive tone based on a polymer having acid sensitive (deprotectable) groups which form carboxylic acid groups when deprotected, and the developer is preferably a metal-ion free tetraalkylammonium hydroxide solution, such as, for example, aqueous 0.26 N tetramethylammonium hydroxide. A pattern forms by developing.

The developed substrate may then be selectively processed on those substrate areas bared of photoresist, for example, chemically etching or plating substrate areas bared of photoresist in accordance with procedures well known in the art. Suitable etchants include a hydrofluoric acid etching solution and a plasma gas etch such as an oxygen plasma etch. A plasma gas etch removes the underlying coating layer.

The following non-limiting examples are illustrative of the invention.

General Comments:

The following polymers with structures immediately below the named designation (e.g., immediately below the designation "Polymer 1" is the structure thereof) are referred to in the examples which follow:

Polymer 1

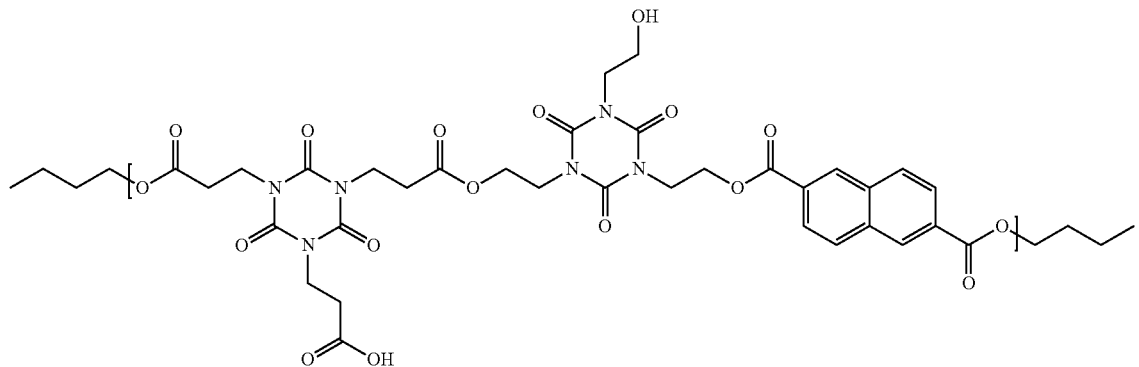

Polymer 2

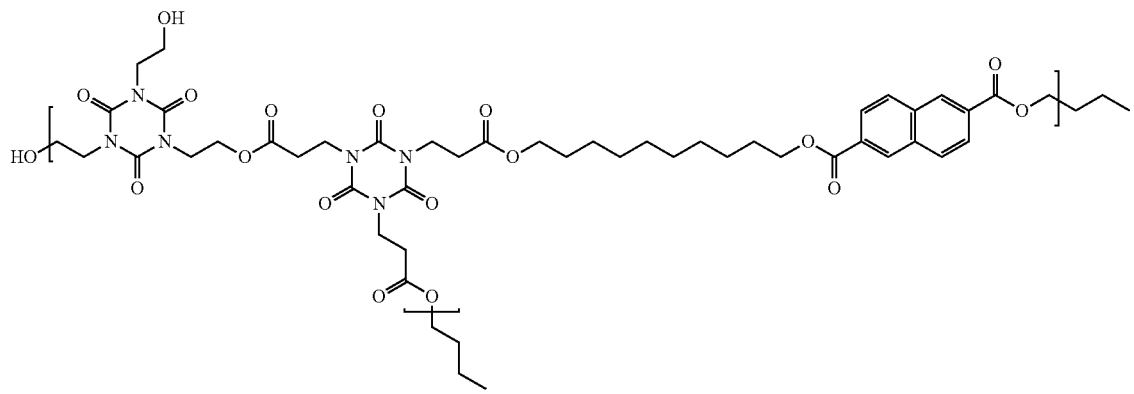

Polymer 3
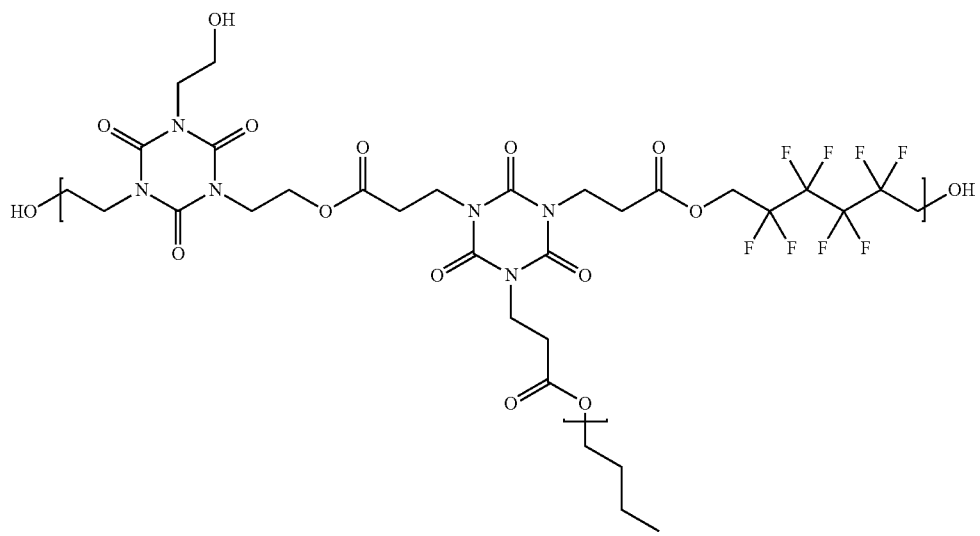
Polymer 4
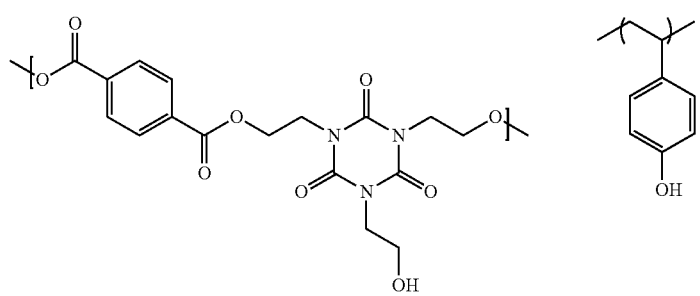
Polymer 5
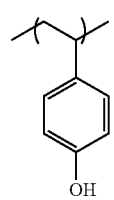
Polymer 6
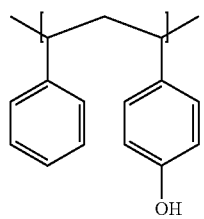
Polymer 7
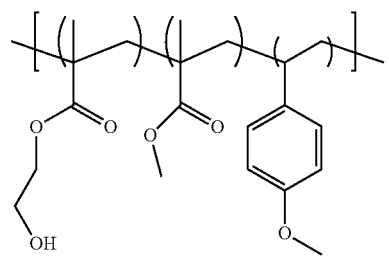
Polymer 8
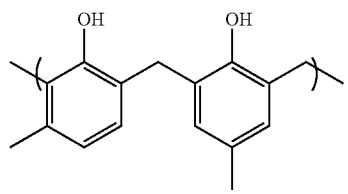
Polymer 9
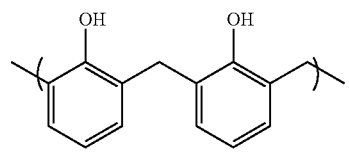
Polymer 10
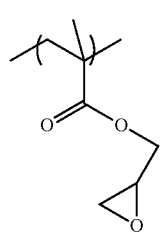

EXAMPLES 1-5

Polymer Synthesis

EXAMPLE 1

Synthesis of Polymer 1 (THEIC-TCEIC-DBNDC)

A 250 mL round bottom flask was charged with 39.8 g of tris(2-hydroxyethyl)isocyanurate, 17.5 of tris(2-carboxyethyl)isocyanurate, 0.73 g of para-toluene sulfonic acid mono-hydrate, 32.1 g of dibutylnathalene dicarboxylate, 67 g of anisole and 100 g of 1-butanol. The mixture was then heated to 140-160° C., and the contents were vigorously stirred. Butanol along with anisole was slowly distilled out of the reaction flask. Polymers were varying Mw were synthesized by controlling the amount of the distillate. The polymer solution was then diluted by adding THF 100 g. The mixture was precipitated from MTBE/IPA (50/50). The above depicted polymer was collected and dried under vacuum at 40-60° C. overnight. The GPC weight average Mw was 3000 with a polydispersity of 1.30.

EXAMPLE 2

Synthesis of Polymer 2
(THEIC-TCEIC-DBNDC-DD)

A 250 mL round bottom flask was charged with 37.8 g of tris(2-hydroxyethyl)isocyanurate, 16.6 g of tris(2-carboxyethyl)isocyanurate, 0.71 g of para-toluene sulfonic acid mono-hydrate, 30.5 g of dibutylnathalene dicarboxylate, 14.9 g of 1,10-decanediol, 80 g of anisole and 100 g of 1-butanol. The mixture was then heated to 140-160° C., and the contents were vigorously stirred. Butanol along with anisole was slowly distilled out of the reaction flask. Polymers were varying Mw were synthesized by controlling the amount of the distillate. The polymer solution was then diluted by adding THF 100 g. The mixture was precipitated from IPA. The above depicted polymer was collected and dried under vacuum at 40-60° C. overnight. The GPC weight average Mw was 6570 with a polydispersity of 1.60.

EXAMPLE 3

Synthesis of Polymer 3
(THEIC-TCEIC-DBNDC-OFHD)

A 250 mL round bottom flask was charged with 49.2 g of tris(2-hydroxyethyl)isocyanurate, 21.6 of tris(2-carboxyethyl)isocyanurate, 0.92 g of para-toluene sulfonic acid mono-hydrate, 29.12 g of 2,2,3,3,4,4,5,5-Octafluoro-1,6-hexanediol, 100 g of anisole and 100 g of 1-butanol. The mixture was then heated to 140-150° C., and the contents were vigorously stirred. Butanol along with anisole was slowly distilled out of the reaction flask. Polymers were varying Mw were synthesized by controlling the amount of the distillate. The polymer solution was then diluted by adding THF 100 g. The mixture was precipitated from IPA. The above depicted polymer was collected and dried under vacuum at 40-60° C. overnight. The GPC weight average Mw was 4560 with a polydispersity of 1.70.

EXAMPLE 4

Synthesis of Polymer 4 (THEIC-DMT)

A 250 mL round bottom flask was charged with 46.09 g of tris(2-hydroxyethyl)isocyanurate, 21.6 of tris(2-carboxyethyl)isocyanurate, 1.35 g of para-toluene sulfonic acid mono-hydrate, 31.15 g of dimethyl terephthalate, 52 g of anisole. The mixture was then heated to 140-150° C., and the contents were vigorously stirred. Methanol along with anisole was slowly distilled out of the reaction flask. Polymers were varying Mw were synthesized by controlling the amount of the distillate. The polymer solution was then diluted by adding HBM 100 g. The mixture was precipitated from IPA. The above depicted polymer was collected and dried under vacuum at 40-60° C. overnight. The GPC weight average Mw was 3000 with a polydispersity of 1.4.

EXAMPLE 5

Synthesis of Polymer 7 (MMA-HEMA-VA)

31.81 g of 2-hydroxy ethyl methacrylate, 24.47 g of methyl methacrylate and 43.72 g of vinyl anisole were dissolved in 150 g of propylene glycol mono methyl ether in a 250 ml, 3-neck round bottom fitted with overhead stirring, a condenser, and a nitrogen inlet. The reaction solution was degassed with a stream of nitrogen for 20 min and heated to 100° C. The 4.98 g of V-67 initiator was added to the reaction solution over 4 hours. The reaction solution was maintained at 100° C. for 8 hours and cooled to room temperature. The polymer solution was then diluted by adding HBM 100 g. The mixture was precipitated into IPE. The polymer was collected by vacuum filtration and vacuum dried at 60° C. for 24 hours. The GPC weight average Mw was 11400 with a polydispersity of 1.98.

EXAMPLES 6-12

Antireflective Coating Compositions

EXAMPLE 6

BARC Composition 1 (Comparative)

3.198 g of the ester type polymer 1, 0.570 g of a tetra methoxy methyl glycoluril as a crosslinker, 0.030 g of ammonium p-toluenesulfonate salt, and 0.002 g of polyfox 656 as a leveling agent were dissolved in 96.2 g of mixture solvents (HBM/GBL 90/10 wt/wt) to obtain the solution. All the prepared solutions were filtered through an ultrahigh molecular weight polyethylene membrane filter. The solution was coated on a silicon wafer using a spinner and the wafer was heated at 205 C for 1 minute on a hot plate to form an anti-reflective coating. Measurement of the anti-reflective coating by a spectral ellipsometer indicated a refractive index n of 1.74 and optical extinction coefficient k of 0.18 at 248 nm.

EXAMPLE 7

BARC Composition 2

2.186 g of the ester type polymer 1, 1.457 g of poly glycidyl methacrylate (polymer 10), 0.056 g of N-benzyl-N,N-dimethylbenzenaminium trifluoromethane sulfonate salt, 0.002 g of polyfox 656 as a leveling agent were dissolved in 96.3 g of mixture solvents (HBM/PGMEA 70/30 wt/wt) to obtain the solution. All the prepared solutions were filtered through an ultrahigh molecular weight polyethylene membrane filter. The solution was coated on a silicon wafer using a spinner and the wafer was heated at 205 C for 1 minute on a hot plate to form an anti-reflective coating. Measurement of the anti-reflective coating by a spectral ellipsometer indicated a refractive index n of 1.71 and optical extinction coefficient k of 0.16 at 248 nm.

EXAMPLE 8

BARC Composition 3

2.186 g of the ester type polymer 2, 1.457 g of poly glycidyl methacrylate (polymer 10), 0.056 g of N-benzyl-N,N-dimethylbenzenaminium trifluoromethane sulfonate salt, and 0.002 g of polyfox 656 as a leveling agent were dissolved in 96.3 g of mixture solvents (HBM/PGMEA/GBL 60/30/10 wt/wt) to obtain the solution. All the prepared solutions were filtered through an ultrahigh molecular weight polyethylene membrane filter. The solution was coated on a silicon wafer using a spinner and the wafer was heated at 205 C for 1 minute on a hot plate to form an anti-reflective coating. Measurement of the anti-reflective coating by a spectral ellipsometer indicated a refractive index n of 1.72 and optical extinction coefficient k of 0.18 at 248 nm.

EXAMPLE 9

BARC Composition 4

4.018 g of the vinyl type polymer 5, 1.339 g of poly glycidyl methacrylate (polymer 10), and 0.003 g of polyfox 656 as a leveling agent were dissolved in 94.6 g of mixture solvents (HBM/PGMEA 70/30 wt/wt) to obtain the solution. All the prepared solutions were filtered through an ultrahigh molecular weight polyethylene membrane filter. The solution was coated on a silicon wafer using a spinner and the wafer was heated at 215 C for 1 minute on a hot plate to form an anti-reflective coating. Measurement of the anti-reflective coating by a spectral ellipsometer indicated a refractive index n of 1.79 and optical extinction coefficient k of 0.01 at 248 nm.

EXAMPLE 10

BARC Composition 5

3.148 g of the vinyl type polymer 6, 1.349 g of poly glycidyl methacrylate (polymer 10), and 0.002 g of polyfox 656 as a leveling agent were dissolved in 95.5 g of PGMEA to obtain the solution. All the prepared solutions were filtered through an ultrahigh molecular weight polyethylene membrane filter. The solution was coated on a silicon wafer using a spinner and the wafer was heated at 215 C for 1 minute on a hot plate to form an anti-reflective coating. Measurement of the anti-reflective coating by a spectral ellipsometer indicated a refractive index n of 1.77 and optical extinction coefficient k of 0.04 at 248 nm.

EXAMPLE 11

BARC Composition 6

2.215 g of the methacrylate type polymer 7, 2.215 g of poly glycidyl methacrylate (polymer 10), 0.068 g of N-benzyl-N,N-dimethylbenzenaminium trifluoromethane sulfonate salt, and 0.002 g of polyfox 656 as a leveling agent were dissolved in 95.5 g of PGMEA to obtain the solution. All the prepared solutions were filtered through an ultrahigh molecular weight polyethylene membrane filter. The solution was coated on a silicon wafer using a spinner and the wafer was heated at 215 C for 1 minute on a hot plate to form an anti-reflective coating. Measurement of the anti-reflective coating by a spectral ellipsometer indicated a refractive index n of 1.65 and optical extinction coefficient k of 0.002 at 248 nm.

EXAMPLE 12

BARC Composition 7

2.249 g of the novolac type polymer 9, 2.249 g of poly glycidyl methacrylate (polymer 10), and 0.002 g of polyfox 656 as a leveling agent were dissolved in 95.5 g of PGMEA to obtain the solution. All the prepared solutions were filtered through an ultrahigh molecular weight polyethylene membrane filter. The solution was coated on a silicon wafer using a spinner and the wafer was heated at 215 C for 1 minute on a hot plate to form an anti-reflective coating. Measurement of the anti-reflective coating by a spectral ellipsometer indicated a refractive index n of 1.82 and optical extinction coefficient k of 0.05 at 248 nm.

EXAMPLE 13

Cross-linking Temperature Analysis by Solvent Resistance Test of Coating Compositions The solutions of BARC forming compositions that were obtained in Comparative Example 6 and Examples 7 and 8 were coated on silicon wafer substrates by means of a spinner, respectively. The coated silicon wafer substrates were baked at temperatures ranging from 60° C. to 215° C. for 60 s. The thickness of samples was them measured. Mixed solvent of 70% propylene glycol methyl ether (PGME) and 30% propylene glycol methyl ether acetate (PGMEA) was dispensed on the silicon wafer on which UL materials were coated, and then kept for 90 s, followed by spin drying at 1500 rpm for 15 s and at 5000 rpm for 30 s to remove the solvent. The film was them baked on a hotplate at 110° C. for 60 seconds. The thickness of films was measured again. The amount of stripping was determined to be the difference between the initial and final thicknesses.

EXAMPLE 14

Film Shrinkage Analysis

The solutions of BARC forming compositions that were obtained in Comparative Example 6 and Examples 7 and 8 were coated on silicon wafer substrates by means of a spinner, respectively. The thickness of samples was them measured before curing. The coated silicon wafer substrates were baked at 205° C. or 215° C. for 60 s, and then the thickness of films was measured again.

TABLE 1

| Crosslinking temp. (° C.) and Film shrinkage (A) | | |
|---|---|---|
| | Crosslinking temp. (° C.) | Film shrinkage (A) |
| Comparative example 6 | 100 | 120 |
| Example 7 | 180 | 52 |
| Example 8 | 170 | 81 |

EXAMPLE 15

Lithography

Figure 1B:
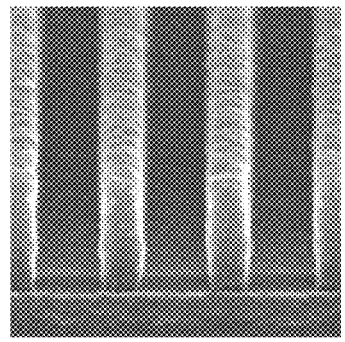

The BARC compositions of Comparative Example 6 and Example 7 are spin-coated on 150-mm silicon wafers at 1500 rpm, and then baked at 205° C. for 60 seconds using a TEL Mark 8 wafer coating track machine. The BARC coating thickness after bake is suitably about 1200 Å. Dow UV™1610 DUV photoresist is spin-coated on top of BARC coating and baked at 100° C. for 60 seconds. The photoresist layer is next exposed through a target mask using a 248 nm KrF wafer stepper with 0.65 NA. The photoresist layer is next post-exposure baked at 120° C. for 60 seconds, and then developed using Dow MF™ CD-26 TMAH developer in a standard 60 second single puddle process. Scanning electron microscopy (SEM) at 80 k magnification was conducted to examine the quality of the photoresist pattern profiles (120 nm line and 240 nm space patterns), with the resulting SEM photomicrographs set forth in FIG. 1A (depicts composition of Comparative Example 6) and FIG. 1B (depicts composition of Example 7). Both compositions of Examples 6 and 7 showed good lithographic performance without difference from the crosslinker resin.

EXAMPLE 16

Figure 2A:
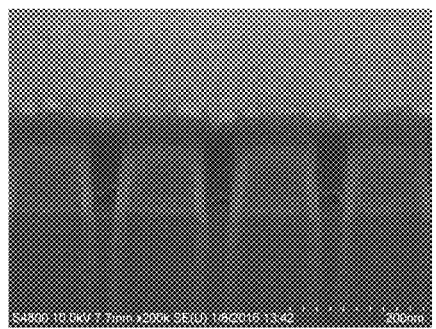
FIGS. 2A and 2B show results of Example 16 which follows.
Figure 2B:
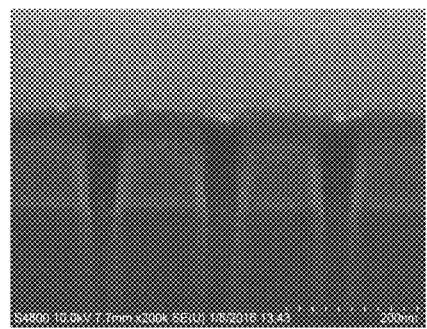

Gap-fill Process 12-inch patterned 100 nm height LPCVD TiN on silicon wafers were provided. The patterns included trenches having a 40 nm space and 120 nm pitch. The BARC compositions of Comparative Example 6 and Example 8 were each spin-coated over the patterned surface of a respective wafer at 1500 rpm to give a film thickness of about 100 nm. The compositions were heated on a hotplate at 215° C. for one minute to promote crosslinking. The trench patterns after crosslinking are shown in the SEM photomicrographs of FIG. 2A-B. The trenches were filled without the formation of voids by the composition of Example 8 (SEM shown in FIG. 2B) while the composition of Comparative example 6 (SEM shown in FIG. 2A) showed voids.

What is claimed is:

1. A method for forming a photoresist relief image, comprising:
    a) applying on a substrate a layer of a coating composition comprising:
        1) a first resin that comprises one or more epoxy reactive groups, and wherein the first resin is a polyester and comprises polyester cyanurate groups; and
        2) a crosslinker resin that is distinct from the first resin and comprises epoxy groups,
        wherein: i) the crosslinker resin is free of any epoxy reactive groups; or (ii) the first resin and/or crosslinker resin comprises optionally substituted phenyl groups, optionally substituted naphthyl groups or optionally substituted anthracenyl groups; and
    b) applying a layer of a photoresist composition above the coating composition layer,
    wherein the following 1), 2) and/or 3):
    1) the crosslinker resin comprises one or more repeat units of the following Formula (1):

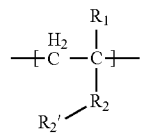

(1)

wherein:
R$_1$ is selected from the group consisting of hydrogen, halogen, and cyano;
R$_2$ is a linking group selected from the group consisting of —C(=O)-O-, -O-, -(CH$_2$)$_n$-O-, and -O-CH$_2$)$_n$- where n is a positive integer, -(CH$_2$)$_n$- where n is a positive integer, -(optionally substituted carbocyclic aryl)-O-, -(optionally substituted carbocylic aryl)-, -O-(optionally substituted carbocyclic aryl)-, -(optionally substituted heteroaryl)-O-, -(optionally substituted heteroaryl)-, and -O-(optionally substituted heteroaryl)-,
R$_{2'}$ is selected from the group consisting of optionally substituted C$_1$ to C$_{12}$ linear, branched or cyclic alkyl, and optionally substituted C$_6$ to C$_{15}$ aryl, optionally containing heteroatoms, and wherein R$_{2'}$ comprises at least one epoxy group,
or R$_2$ and R$_{2'}$ are taken together to form a carbon alicyclic ring that comprises a pendant or fused epoxy group; and/or
2) the first resin comprises a unit of the following Formula (2):

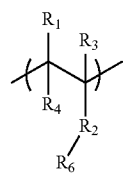

(2)

wherein in Formula (2): R$_1$ is selected from the group consisting of hydrogen, halogen, cyano, and optionally substituted alkyl;
R$_2$ is a linking group selected from the group consisting of —C(=O)-O-, -O-, -(CH$_2$)$_n$-O-, and -O-(CH$_2$)$_n$- where n is a positive integer, -(CH$_2$)$_n$- where n is a nonnegative integer, -(optionally substituted carbocyclic aryl)-O-, -(optionally substituted carbocylic aryl)-, -O-(optionally substituted carbocyclic aryl)-, -(optionally substituted heteroaryl)-O-, -(optionally substituted heteroaryl)-, and -O-(optionally substituted heteroaryl)-,
R$_3$ is selected from the group consisting of hydrogen, halogen, cyano, and optionally substituted alkyl; and
R$_4$ is hydrogen, optionally substituted alkyl, optionally substituted carbocyclic aryl, or optionally substituted heteroaryl; and
R$_6$ is optionally substituted alkyl, optionally substituted cyclic alkyl, and optionally substituted carbocyclic aryl, and optionally substituted heteroaryl, wherein R6 comprises at least one group that comprises a nucleophilic oxygen, nitrogen or sulfur group, and/or
3) the crosslinker resin is an acrylate epoxy resin.

2. The method of claim 1 wherein the first resin epoxy reactive groups comprise a hydroxy, amine and/or thio moiety and/or other nucleophilic group that comprises a nucleophilic oxygen, nitrogen or sulfur group that can react with an epoxy group of the crosslinker resin during thermal treatment of the coating composition.

3. The method of claim 1 wherein the crosslinker resin is free of any epoxy reactive groups.

4. The method of claim 1 wherein the first resin is free of any epoxy groups.

5. The method of claim 1 wherein the crosslinker resin is an acrylate epoxy resin.

6. The method of claim 1 wherein the first resin and/or crosslinker resin comprises optionally substituted phenyl groups, optionally substituted naphthyl groups or optionally substituted anthracenyl groups.

7. The method of claim 1 wherein the crosslinker resin comprises one or more repeat units of the following Formula (1):

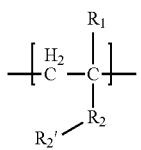

(1)

wherein:
$R_1$ is selected from the group consisting of hydrogen, halogen, and cyano;
$R_2$ is a linking group selected from the group consisting of —C(=O)-O-, -O-, -(CH$_2$)$_n$-O-, and -O-(CH$_2$)$_n$- where n is a positive integer, -(CH$_2$)$_n$- where n is a positive integer, -(optionally substituted carbocyclic aryl)-O-, -(optionally substituted carbocyclic aryl)-, -O-(optionally substituted carbocyclic aryl)-, -(optionally substituted heteroaryl)-O-, -(optionally substituted heteroaryl)-, and -O-(optionally substituted heteroaryl)-,
$R_{2'}$ is selected from the group consisting of optionally substituted $C_1$ to $C_{12}$ linear, branched or cyclic alkyl, and optionally substituted $C_6$ to $C_{15}$ aryl, optionally containing heteroatoms, and wherein $R_{2'}$ comprises at least one epoxy group,
or $R_2$ and $R_{2'}$ are taken together to form a carbon alicyclic ring that comprises a pendant or fused epoxy group.

8. The method of claim 1 wherein the first resin comprises a unit of the following Formula (2):

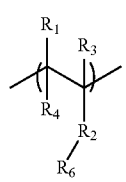

(2)

wherein in Formula (2): $R_1$ is selected from the group consisting of hydrogen, halogen, cyano, and optionally substituted alkyl;
$R_2$ is a linking group selected from the group consisting of —C(=O)-O-, -O-, -(CH$_2$)$_n$-O-, and -O-(CH$_2$)$_n$- where n is a positive integer, -(CH$_2$)$_n$- where n is a nonnegative integer, -(optionally substituted carbocyclic aryl)-O-, -(optionally substituted carbocyclic aryl)-, -O-(optionally substituted carbocyclic aryl)-, -(optionally substituted heteroaryl)-O-, -(optionally substituted heteroaryl)-, and -O-(optionally substituted heteroaryl)-, $R_3$ is selected from the group consisting of hydrogen, halogen, cyano, and optionally substituted alkyl; and
$R_4$ is hydrogen, optionally substituted alkyl, optionally substituted carbocyclic aryl, or optionally substituted heteroaryl; and
R6 is optionally substituted alkyl, optionally substituted cyclic alkyl, and optionally substituted carbocyclic aryl, and optionally substituted heteroaryl, wherein R6 comprises at least one group that comprises a nucleophilic oxygen, nitrogen or sulfur group.

9. The method of claim 8 wherein the first resin further comprises a unit of the following Formula (3):

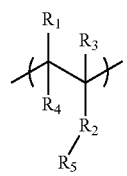

(3)

wherein in Formula (3):
$R_1$ is selected from the group consisting of hydrogen, halogen, cyano, and optionally substituted alkyl;
$R_2$ is a linking group selected from the group consisting of —C(=O)-O-, -O-, -(CH$_2$)$_n$-O-, and -O-(CH$_2$)$_n$- where n is a positive integer, -(CH$_2$)$_n$- where n is a nonnegative integer, -(optionally substituted carbocyclic aryl)-O-, -(optionally substituted carbocyclic aryl)-, -O-(optionally substituted carbocyclic aryl)-, -(optionally substituted heteroaryl)-O-, -(optionally substituted heteroaryl)-, and -O-(optionally substituted heteroaryl)-,
$R_3$ is selected from the group consisting of hydrogen, halogen, cyano, and optionally substituted alkyl; and
$R_4$ and $R_5$ are independently selected from the group consisting of hydrogen, optionally substituted alkyl, optionally substituted carbocyclic aryl, and optionally substituted heteroaryl.

10. The method of claim 1 wherein the first resin comprises:
a unit of the following Formula (4):

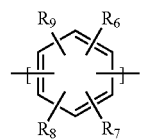

(4)

wherein, $R_6$, $R_7$, $R_8$, and $R_9$ are each independently selected from hydrogen, optionally substituted alkyl, optionally substituted alkenyl, optionally substituted alkynyl group, optionally substituted alkoxy, optionally substituted cycloalkenyl group, optionally substituted C2 to C20 heterocycloalkyl, optionally substituted $C_2$ to $C_{20}$ heterocycloalkenyl, optionally substituted heterocycloalkynyl group, optionally carbocyclic aryl or optionally substituted heteroaryl, and where at least one of $R_6$, $R_7$, $R_8$, and $R_9$ comprises at least one group that comprises least one nucleophilic oxygen, nitrogen or sulfur group.

11. The method of claim 1 wherein the first resin is a polyester prepared by condensation of monomers comprising cyanurate groups,
wherein:
a) monomers comprising cyanurate groups comprise a structure of the following Formula (5)

Formula (5)

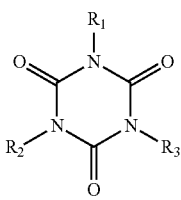

Formula (5)

wherein in Formula (5):
$R_1$, $R_2$, $R_3$ are independently hydrogen or a non-hydrogen substituent, wherein at least one of $R_1$, $R_2$, $R_3$ comprises a group that comprises a hydroxyl, carboxyl, amine, or thio moiety.

12. The method of claim 1 wherein the coating composition comprises a thermal acid generator.

13. The method of claim 1 wherein the first resin is a polyester comprising units comprising 1) cyanurate groups, 2) hydrophobic groups, and 3) aromatic groups.

14. The method of claim 1 wherein the first resin is a polyester prepared by condensation of monomers comprising 1) cyanurate groups, 2) hydrophobic groups, and 3) aromatic groups,
wherein:
monomers comprising cyanurate groups comprise a structure of the following Formula (5) Formula (5)

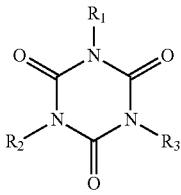

Formula (5)

wherein in Formula (5):
$R_1$, $R_2$, $R_3$ are independently hydrogen, optionally substituted alkyl, optionally substituted alkenyl or alkynyl, optionally substituted cyclic alkyl, and optionally substituted carbocyclic aryl, optionally substituted heteroaryl, optionally substituted alkylester, optionally substituted alkyl ether wherein at least one of $R_1$, $R_2$, $R_3$ has a group that comprises a hydroxyl, carboxyl, amine, or thio moiety;

monomers comprising hydrophobic groups comprise a structure of the following Formula (6)

Formula (6)
$R_1$—$R_4$—$R_2$ $R_1$, $R_2$ are the same as defined in Formula (5) wherein at least one of $R_1$, $R_2$ has a group that comprises a hydroxyl, carboxyl, amine, or thio moiety; R4 is optionally substituted alkyl, optionally substituted alkenyl, or optionally substituted alkynyl, or optionally halogenated alkyl;

monomers comprising aromatic groups that comprise a structure the following Formula (7)

Formula (7)
$R_1$—Ar—$R_2$ $R_1$, $R_2$ are the same as defined in Formula (5) wherein at least one of $R_1$, $R_2$ has a group that comprises a hydroxyl, carboxyl, amine, or thio moiety; aromatic group is optionally substituted alkaryl.

15. A coated substrate comprising:
1) a substrate having a layer of a coating composition comprising:
i) a first resin that comprises one or more epoxy reactive groups, and wherein the first resin is a polyester and comprises polyester cyanurate groups; and
ii) a crosslinker resin that is distinct from the first resin and comprises epoxy groups;
wherein the crosslinker resin is free of any epoxy reactive groups; and
2) a photoresist composition layer above the coating composition layer.

16. The substrate of claim 15 wherein the first resin is free of any epoxy groups.

17. The coated substrate of claim 15 wherein the first resin and/or crosslinker resin comprises optionally substituted phenyl groups, optionally substituted naphthyl groups or optionally substituted anthracenyl groups.

18. A coating composition for use with an overcoated photoresist composition, the coating composition comprising:
i) a first resin that comprises one or more epoxy reactive groups, and wherein the first resin is a polyester and comprises polyester cyanurate groups; and
ii) a crosslinker resin that is distinct from the first resin and comprises epoxy groups;
wherein the crosslinker resin is free of any epoxy reactive groups.

19. The composition of claim 18 wherein the first resin is free of any epoxy groups.

20. The coating composition of claim 18 wherein the first resin and/or crosslinker resin comprises optionally substituted phenyl groups, optionally substituted naphthyl groups or optionally substituted anthracenyl groups.

* * * * *